US010372859B2

(12) United States Patent
Nagaraja

(10) Patent No.: US 10,372,859 B2
(45) Date of Patent: Aug. 6, 2019

(54) SYSTEM AND METHOD FOR DESIGNING SYSTEM ON CHIP (SOC) CIRCUITS USING SINGLE INSTRUCTION MULTIPLE AGENT (SIMA) INSTRUCTIONS

(71) Applicant: ALPHAICS CORPORATION, Wilmington, DE (US)

(72) Inventor: Nagendra Nagaraja, Bangalore (IN)

(73) Assignee: ALPHAICS CORPORATION, Wilmington ( * ) Notice: Subject to any disclaimer, the term of this patent is extended or adjusted under 35 U.S.C. 154(b) by 0 days.

(21) Appl. No.: 15/859,698

(22) Filed: Jan. 1, 2018

(65) Prior Publication Data

US 2018/0260498 A1    Sep. 13, 2018

Related U.S. Application Data

(60) Continuation-in-part of application No. 15/697,803, filed on Sep. 7, 2017, now Pat. No. 9,892,223, which is a division of application No. 15/499,832, filed on Apr. 27, 2017, now Pat. No. 9,792,397, application No. 15/859,698, which is a continuation-in-part of application No. 15/455,126, filed on Mar. 9, 2017, now Pat. No. 9,754,221.

(51) Int. Cl.
*G06F 17/50* (2006.01)
*G06F 9/455* (2018.01)

(52) U.S. Cl.
CPC .......... *G06F 17/505* (2013.01); *G06F 17/504* (2013.01)

(58) Field of Classification Search
USPC ....................... 716/102, 104, 106
See application file for complete search history.

(56) References Cited

U.S. PATENT DOCUMENTS

| | | | |
|---|---|---|---|
| 2011/0010164 A1* | 1/2011 | Williams | G06F 17/2881 704/9 |
| 2016/0063992 A1* | 3/2016 | Selfridge | G10L 15/22 704/254 |

* cited by examiner

*Primary Examiner* — Brian Ngo
(74) *Attorney, Agent, or Firm* — Barry Choobin; Patent 360 LLC

(57) ABSTRACT

The embodiments herein discloses a system and method for designing SoC by using a reinforcement learning processor. An SoC specification input is received and a plurality of domains and a plurality of subdomains is created using application specific instruction set to generate chip specific graph library. An interaction is initiated between the reinforcement learning agent and the reinforcement learning environment using the application specific instructions. Each of the SoC sub domains from the plurality of SoC sub domains is mapped to a combination of environment, rewards and actions by a second processor. Further, interaction of a plurality of agents is initiated with the reinforcement learning environment for a predefined number of times and further Q value, V value, R value, and A value is updated in the second memory module. Thereby, an optimal chip architecture for designing SoC is acquired using application-domain specific instruction set (ASI).

14 Claims, 20 Drawing Sheets

SYSTEM AND METHOD FOR DESIGNING SYSTEM ON CHIP (SOC) CIRCUITS USING SINGLE INSTRUCTION MULTIPLE AGENT (SIMA) INSTRUCTIONS

CROSS-REFERENCE TO RELATED APPLICATION

This application is a continuation-in-part of the divisional application with the Ser. No. 15/697,803 filed on Sep. 7, 2017 with the title "SYSTEM AND METHOD FOR DESIGNING SYSTEM ON CHIP (SoC) CIRCUITS BY SYNCHRONIZING A HIERARCHY OF SMDPs" and claims priority from U.S. Non-Provisional patent application Ser. No. 15/455,126, filed on Mar. 9, 2017, entitled "PROCESSOR FOR IMPLEMENTING REINFORCEMENT LEARNING OPERATIONS" and also claims the priority of the U.S. Non-Provisional patent application with Ser. No. 15/499,832, filed on Apr. 27, 2017, with the title "SYSTEM AND METHOD FOR DESIGNING SYSTEM ON CHIP (SoC) CIRCUITS THROUGH ARTIFICIAL INTELLIGENCE AND REINFORCEMENT LEARNING". The contents of abovementioned applications are included entirely as reference herein.

BACKGROUND

Technical Field

The embodiments herein is related to apparatuses/systems for designing Integrated Circuits (IC). The embodiments herein is particularly related to apparatuses/systems for designing IC such as system on chip (SoC). The embodiments herein is more particularly related to a system and method for designing system on chip (SoC) using artificial intelligence (AI) and reinforcement learning processor.

Description of Related Art

System on Chip (SOC) is an integrated circuit (IC) that integrates all the components of an electrical/electronic system into a single chip. The integrated circuit typically comprises digital functions, analog functions, mixed-signal functions and radio-frequency functions inter-alia embedded onto a single chip substrate. The integrated circuit typically includes hardware (for example, microprocessors, and microcontrollers) and also the software necessary for controlling the functionalities and implementation of the hardware.

Typically, SoCs are developed from pre-qualified hardware blocks corresponding to the hardware elements to be included there into, and along with the software drivers that control the functionalities of the said hardware elements. Typically, the hardware elements are assembled using well known Computer Aided Design (CAD) tools, and the corresponding software modules are integrated using an integrated software development environment subsequent to the finalization of SoC circuit architecture.

The design flow for typical SoC circuits are fragmented and implemented manually. Further, the process of converting a design flow (of a SoC circuit) into a physical design is not free from (design related) errors due to a manual implementation and fragmented nature (of the corresponding design flow). Typically, functional verification (for determining whether the logic design of the SoC circuit confirms to the design specification), which forms a critical part of the transformation from design flow (of a SoC circuit) to physical design, demands the largest pool of resources (in terms of time, manpower inter-alia), due to the complexity of the SoC circuit design as well as the enormity of possible test cases/test scenarios necessary to completely verify the SoC circuit design in its entirety. Typically, the design phase of a SoC circuit involves use of a plurality of discrete tools along with the use of multiple formats and implementation procedures.

Current SoC design process includes the steps of receiving a system specification, architectural design, functional and logic design, circuit design, physical design, physical verification, and fabrication of chip. Further, each process generates data that are highly correlated. At present, there is no system and method available and exist for generalization and learnability of data generated in chip designing process.

The existing process of SoC chip design does not teach about implementing an AI framework into the manual chip design process. AI framework helps in automating the process of chip design, thereby making the design process quick, speedy and efficient. Further, the AI framework helps in learning the data generated during the chip design process.

The advanced AI based framework for chip design is not supported by general purpose computer based on RISC and GPGPU and even FPGAs. Further, existing hardware do not provide Application specific Instructions configured to perform SoC chip design.

Hence, there is a need for an improvised system for achieving SoC design circuits, apart from mitigating the risks associated with SoC circuit design process and rendering the (SoC circuit) design process cost effective. Further, there is a need for a system that automates the process of SoC design using application specific instructions, thereby improving efficiency due to the complexities associated with the design and implementation of SoC circuits. Furthermore, there exists a need for an advanced system that supports the AI based chip design framework.

The abovementioned shortcomings, disadvantages and problems are addressed herein, which will be understood by reading and studying the following specification.

OBJECTIVES OF THE EMBODIMENTS

An object of the embodiments herein is to provide a system with AI processor implementing SoC design framework.

Another object of the embodiments herein is to provide a system with application specific instructions or Single Instruction Multiple Agent instructions for designing SoC.

Yet another object of the embodiments herein SoC design framework that employs reinforcement learning techniques to improve the design and implementation of SoC circuit design.

Yet another object of the embodiments herein is to provide an artificial intelligence based framework optimized for SoC design and implementation.

Yet another object of the embodiments herein is to provide a method for learning and inferencing from SoC design that can be used for future designing of SoC.

Yet another object of the embodiments herein is to provide a SoC design framework that automates the process of SoC design and implementation.

Yet another object of the embodiments herein is to provide a SoC design framework by synchronizing a hierarchy of SMDPs.

Another object of the embodiments herein is to provide a SoC design framework that is flexible and modular in construction.

Yet another object of the embodiments herein is to provide a SoC design framework that reduces a risk and uncertainty associated with SoC design and implementation process.

Yet another object of the embodiments herein is to provide a SoC design framework that generates optimal SoC configurations.

Yet another object of the embodiments herein is to provide a SoC design framework that provides easy insights on the architecture of a SoC circuit, and enables easy customization of SoC circuits.

These and other objects and advantages of the present invention will become readily apparent from the following detailed description taken in conjunction with the accompanying drawings.

SUMMARY

The present disclosure discloses a processor (termed as 'reinforcement learning processor' hereafter) specifically configured to design SoC. In accordance with the present disclosure, the application-specific instruction set executed by the reinforcement learning processor incorporates 'Single Instruction Multiple Agents (SIMA)' type instructions. SIMA type instructions when executed by the reinforcement learning processor are specifically designed to be implemented simultaneously on a plurality of reinforcement learning agents which in turn are interacting with corresponding reinforcement learning environments. The SIMA type instructions when executed by the reinforcement learning processor are configured to create a plurality of domains and a plurality of subdomains for artificial intelligence (AI) setup to generate chip specific graph library.

According to an embodiment herein, a computer-implemented system for designing SoC, includes a first processor configured to create at least one reinforcement learning agent and at least one corresponding reinforcement learning environment, said first processor further configured to assign a reinforcement learning agent ID to said reinforcement learning agent, and a reinforcement learning environment ID to said reinforcement learning environment. The system further includes a first memory module communicably coupled to said first processor, said first memory module configured to store an application-domain specific instruction set (ASI). SoC specification input and a chip database library. The application-domain specific instruction set includes instructions for initializing a chip topology from the SoC specification, the application-domain specific instruction set further configured to create a plurality of domains and a plurality of subdomains for artificial intelligence (AI) setup to generate chip specific graph library, each of said instructions incorporating at least one of said reinforcement learning agent ID and said reinforcement learning environment ID as an operand. The system includes a complex instruction fetch and decode (CISFD) unit communicably coupled to said memory module. The CISFD unit configured to decode at least one of said instructions, and generate a plurality of predetermined threads corresponding to decoded instruction. The CISFD unit still further configured to embed into the predetermined threads, at least one of said reinforcement learning agent ID and reinforcement learning environment ID associated with the decoded instruction. The system includes a second processor configured to initiate an interaction between the reinforcement learning agent and the reinforcement learning agent environment. The second processor includes a plurality of cores, and configured to apply a corresponding instruction onto at least one of a reinforcement learning agent and reinforcement learning environment identified by the reinforcement learning agent ID and reinforcement learning environment ID to map each of the SoC sub domains from the plurality of SoC sub domains to a combination of environment, rewards and actions. The second processor is further configured to generate Q values for each domain using the reinforcement learning agent. The system further includes a second memory module cooperating with said second processor. The second memory module is an on-chip memory, external DRAM, hard disk drive. The second memory module is configured to store the extracted Q values of each domain and subdomain in a hierarchical SMDP structure in a form of SMDP Q table for optimization for planning SoC. According to an embodiment herein, the second processor is further configured to acquire optimal chip architecture for designing SoC using application-domain specific instruction set (ASI). The application-domain specific instruction set are single instruction multiple agents (SIMA) based instructions configured to map reinforcement learning environment to Electronic design automation EDA tools associated with the corresponding AI SoC subdomain. A plurality of reinforcement learning agents are configured to interact with the reinforcement learning environment for a predefined number of times and update Q values, V values, R value, and A value in the second memory module.

According to an embodiment herein, the second processor is further configured to create an empty environment corresponding to the reinforcement learning environment ID. The second processor is also configured to create an empty agent within the reinforcement learning environment denoted by the reinforcement learning environment ID. The plurality of reinforcement learning agents are associated to at least one reinforcement learning environment. Further, a training is initiated on the reinforcement learning agent represented by the reinforcement learning agent ID by using exploration instruction. Thereafter, second processor associates the chip topology to a Markov Decision Process (MDP) with HAM constraints, second processor branches the chip topology to a plurality of SMDPs or MDPs. The second processor activates the plurality of SMDPs or MDPS, and wherein the plurality of activated SMDPs or MDPs is terminated on achieving a preset Q-value or a preset objective. Further, the second processor synchronizes the plurality of SMDPs or MDPs after termination. Further, second processor activates a plurality of subdomains at a same level, and wherein the plurality of activated subdomains is terminated on achieving a preset Q-value or a preset objective. The second processor synchronizes the plurality of subdomains after termination; and initiates a physical verification of the plurality of SMDPs or MDPs.

According to an embodiment herein, the method of SoC chip design includes receiving a SoC specification input from a first memory module. Further, the chip design (of SoC) is initialized by extracting details regarding chip, chip skeleton, clock, Input outputs, partitions that are retrieved from the received SoC specification input and a chip database library. Subsequently, a plurality of domains and a plurality of subdomains is created by artificial intelligence (AI) setup in form of Markov Decision Process (MDP), Semi Markov Decision Process (SMDP)s, Hierarchical Abstract Machines (HAM)s and MAX-Q Q using application specific instruction set to generate chip specific graph library. The artificial intelligence setup comprises a combination of reinforcement learning (AI) agent, a reinforcement learning environment, and a task. The AI setup is created using application specific instructions retrieved from a first memory module. Thereafter, an interaction is initiated between the reinforcement learning agent created and the reinforcement learning environment using the application specific instructions. Each of the SoC sub domains from the plurality of SoC sub domains is mapped to a combination of environment, rewards and actions by a second processor. Mapping is performed on executing an instruction with a reinforcement learning environment ID by the second processor. The Q values for each domain are generated using the reinforcement learning agent. The AI agent is configured to interact with AI environment through task to extract Q values for each domain. Thereafter, the reinforcement learning environment is mapped to respective Electronic design automation EDA tools associated with the corresponding AI SoC subdomain. Sequentially, an interaction of a plurality of agents is initiated with the reinforcement learning environment for a predefined number of times and further Q value, V value, R value, and A value is updated in the second memory module. Thereby, an optimal chip architecture for designing SoC is acquired using application-domain specific instruction set (ASI). The optimal chip architecture corresponds to a maximum Q value of a top level in a SMDP Q table.

According to an embodiment herein, an empty environment corresponding to the reinforcement learning environment ID is created. Further, an empty agent within the reinforcement learning environment denoted by the reinforcement learning environment ID is created. Thereafter, the plurality of reinforcement learning agents is associated to at least one reinforcement teaming environment. Subsequently, training is initiated on the reinforcement learning agent represented by the reinforcement learning agent ID by using exploration instruction. Further, the chip topology is associated to a Markov Decision Process (MDP) with HAM constraints. The chip topology is branched to a plurality of SMDPs or MDPs. The plurality of SMDPs or MDPS are activated. Further, the plurality of activated SMDPs or MDPs is terminated on achieving a preset Q-value or a preset objective. The plurality of SMDPs or MDPs are synchronized after termination. A plurality of subdomains at a same level is activated. Further, the plurality of activated subdomains is terminated on achieving a preset Q-value or a preset objective. Thereafter, the plurality of subdomains are synchronized after termination.

According to an embodiment herein, a backup of each of the plurality of subdomains hierarchically through Hierarchical Deep SMDP network (HDSN). The step of storing the extracted Q values comprises storing Q values in a Q table for leaf level MDPs and options macros.

According to an embodiment herein, in order to achieve the preset Q-value the reinforcement learning techniques is executed and terminated. The reinforcement learning techniques is executed and terminated, when Q value converges below a preset threshold value for each domain or when a change of Q value is reduced below the preset threshold value for each SoC domain. Alternatively, the reinforcement learning techniques is executed and terminated, when a predefined number of episodes is completed for each specific domain. According to an embodiment herein, the reinforcement learning techniques is executed and terminated, when a predefined target performance or predefined exit state is reached for each specific domain. The reinforcement learning techniques is executed and terminated, when a predefined hierarchically optimal state for each domain is achieved.

According to an embodiment herein, the AI agents are configured to feedback the inferences into the graph database and a database which hold Q-values and neural network weights. Examples of AI Agent include but not limited to SoC Noc agent, SoC Power agent, SoC Physical Agent, SoC multiprocessor agent, SoC security agent and SoC clock agent. The AI agent (hereafter referred to as AI agent) is configured to generate Q values for each domain. The AI agent is configured to interact with AI environment through task to extract Q values for each domain. Subsequently, the extracted Q values of each domain and subdomain is stored in a hierarchical SMDP structure is stored in a form of SMDP Q table in a big data database for optimization for planning SoC.

According to an embodiment herein, reinforcement learning process is initiated for each domain to extract Q value. Subsequently, a maximum Q value for each domain is determined through an initialization process of any one of MDPs, SMDPs, and a hierarchy of MDPs. Thereafter, an optimal chip architecture is estimated corresponding to a maximum Q value of a top level in the SMDP Q table. Thereafter, the optimal chip architecture is stored in a database for learning and inference. The desired SoC configuration is generated and optimized based on the optimal chip architecture and the generated chip specific graph library. The step of acquiring an optimal chip architecture from the maximum Q value comprises deriving optimal policies associated with the optimal Q value, and executing actions associated with the derived optimal policy.

According to an embodiment herein, a relation between lower level SMDP, MDPs and options macro Q values is determined using the Deep neural network, when Q values of upper level in the Q tables are calculated. The lower level SMDP, MDPs and options macro Q values are related to Q values of the upper level in Q tables. The Deep neural network is selected from a group consisting of a recurrent network, convolutional network, LSTM, GANs and hierarchy of these networks. A Hierarchical Deep SMDP Network (HDSN) is trained or employed for acquiring optimal value of weights for estimating a relationship function between the pluralities of Q values in the Q tables. The optimal values of weights obtained by training are used to determine a process of estimating higher level Q values as a function of lower level Q values in a hierarchical RL setups. The HDSN is further trained or employed to determine a synchronization mechanism between SMDPS at the same level in the hierarchical RL implementation, by determining appropriate level of threshold Q values to terminate one Semi Markov Decision Process (SMDP) and start another SMDP in tandem. According to an embodiment herein, the step of acquiring an optimal chip architecture from the maximum Q value comprises deriving optimal policies associated with the optimal Q value, and executing actions associated with the derived optimal policy. Further, a relation between lower level SMDPs, and MDPs is determined using a neural network, when Q values of upper level in the Q tables are calculated.

According to an embodiment herein, the plurality of domains comprises SoC Communication and Network on a Chip, SoC power optimization, SoC clocking, SoC physical design, SoC logic verification, SoC physical verification, SoC timing, SoC DRC (Design Rule check), SoC ERC (Electric Rule check), and SoC Package. The plurality of sub domains comprises SoC throughput optimization, SoC dynamic power optimization, SoC timing optimization, SoC placement optimization, SoC safety features, SoC security features, placement, floorplan, Input/Outputs and routing.

According to an embodiment herein, the step of creating a plurality of domains and a plurality of subdomains AI setup includes configuring the plurality of agents with tasks associated to domains and sub domains. Further, the AI environment is configured to provide rewards and observation to a one or more AI agents. Furthermore, the one or more AI agents are configured to receive a feedback regarding the plurality of domains and sub domains.

According to an embodiment herein, the step of optimizing and generating desired SoC configuration includes initiating a planning process for designing Optimal SoC based on hierarchically optimal SMPDs, MDPs or option macros or a combination of all. Further, a model of MDP, SMDP and options is created using a deterministic or stochastic model selected from a group consisting of lookup table model, Linear expectation model, Linear Gaussian model. Gaussian process model, and Deep Belief network model. Furthermore, a planning and learning process is executed for a plurality of AI domains in parallel by using simulated models that are derived based on real time feedback received from the plurality of AI domains and subdomains. The hierarchical representation of planned SoC is stored in the one or more databases, by storing the learnt information about SoC in a preset format. Thereafter, the planned and stored information about SoC is retrieved from a database hierarchically to debug and create new SoC design from the database.

According to an embodiment herein, inferences are generated from extracted SMDP, options macros, MDPs, HAMs, max-Q functions. The generated inferences are stored in the form of document databases, Graph databases or SQL databases. The stored inferences in the form of document databases, Graph databases or SQL databases are loaded into domain specific AI setup in the form of extracted MDPs, SMDPs or options macro or as a set of Environment, Agent, task and experiment in an episodic setup. Each SoC domain AI setup in the form of episodic experiment setup or MDP or SMDP or HAM or MAXQ setup with or without options macros interact with each other to arrive at Optimal Chip Architecture (OCA), when the inferences for each SoC design domain are extracted.

According to an embodiment herein, new policies of mapping state to action are validated for extracted MDPs, SMDPs, options macro, HAMs MAXQ based on policy gradient methods used in Reinforcement learning and storing the validated new policies in the databases for each of AI SoC domains and any AI subdomain in SoC design. The new policies generated in one domain is optimized and iterated with the policies generated in other AI SoC domains to derive context and to obtain hierarchically optimal, multi-domain wise, and subdomain wise optimal policies. The hierarchically optimal and individually optimal policies are stored in the database, through equations, functions, SW, options macros for future use and referred in future learning applications of all AI SoC domains and subdomains.

According to an embodiment herein, synchronization is just one SMDPs communicating with other SMDP, to notify that it has reached terminal state, when SMDPs have no dependency with each other (for example, active power and placement SMDPs). The synchronization is one of a global broadcast signal, to suggest that SMDP reached terminal state. Synchronization process also involves in making the terminated SMDP to upload its end results such as metrics of time closure by timing SMDP or when bugs are found in verification of SMDPs into global database. Alternatively, then each of these SMDPs operate in a lock step or iterative loop when there is a dependency of SMDP on another SMDP. The synchronization process involves a separate sync state when SMDP communicates with other SMDPs (for example, logic Verification and logic design). Each SMDP communicate their end results and wait for bug fixes, optimization and call that design is in decent shape to send it to PD or synthesis. According to an embodiment herein, synchronization includes using two or more SMDPs and sharing end results among many SMDPs, options macro and MDPs.

These and other aspects of the embodiments herein will be better appreciated and understood when considered in conjunction with the following description and the accompanying drawings. It should be understood, however, that the following descriptions, while indicating the preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The other objects, features and advantages will be apparent to those skilled in the art from the following description and the accompanying drawings in which.

Figure 1A:
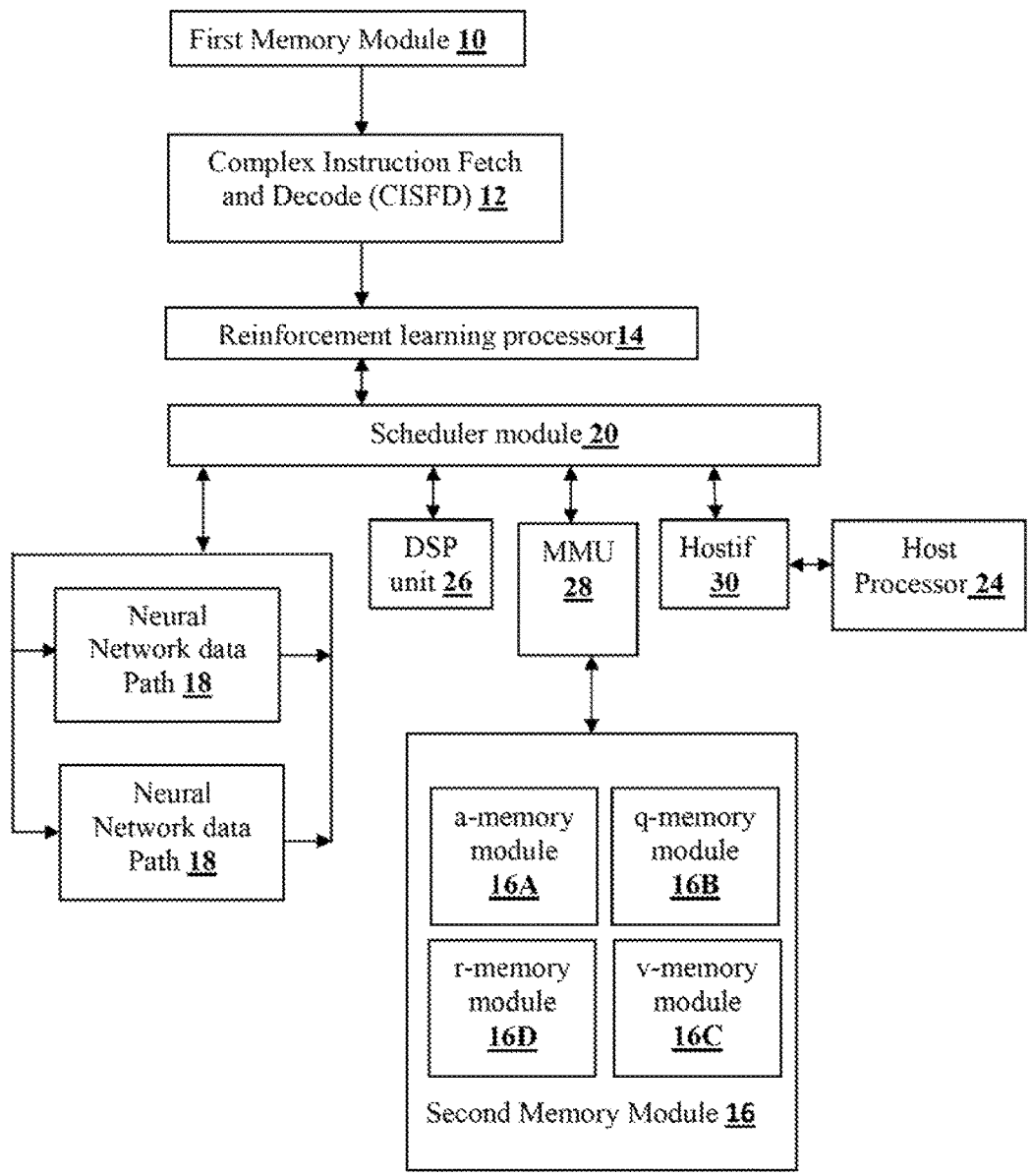
FIG. 1A is a block diagram of a system for designing SoC by synchronizing a hierarchy of SMDPs, according to an embodiment herein.

Although the specific features of the embodiments herein are shown in some drawings and not in others. This is done for convenience only as each feature may be combined with any or all of the other features in accordance with the embodiments herein.

DETAILED DESCRIPTION OF THE EMBODIMENTS HEREIN

In the following detailed description, a reference is made to the accompanying drawings that form a part hereof, and in which the specific embodiments that may be practiced is shown by way of illustration. These embodiments are described in sufficient detail to enable those skilled in the art to practice the embodiments and it is to be understood that other changes may be made without departing from the scope of the embodiments. The following detailed description is therefore not to be taken in a limiting sense.

The present disclosure discloses a processor (termed as 'reinforcement learning processor' hereafter) specifically configured to design SoC. In accordance with the present disclosure, the application-specific instruction set executed by the reinforcement learning processor incorporates 'Single Instruction Multiple Agents (SIMA)' type instructions. SIMA type instructions are specifically designed to be implemented simultaneously on a plurality of reinforcement learning agents which in turn are interacting with corresponding reinforcement learning environments. The SIMA type instructions are configured to create a plurality of domains and a plurality of subdomains for artificial intelligence (AI) setup to generate chip specific graph library.

According to an embodiment herein, the SIMA type instructions are specifically configured to receive either a reinforcement learning agent ID or a reinforcement learning environment ID as the operand. The reinforcement learning agent ID (RL agent ID) corresponds to a reinforcement learning agent, while the reinforcement learning environment ID (RL environment ID) corresponds to a reinforcement learning environment (with which the reinforcement learning agent represented by reinforcement learning agent ID interacts). The SIMA type instructions envisaged by the present disclosure, when executed by the reinforcement learning processor trigger an interaction between the reinforcement learning agent and reinforcement learning environment to derive values corresponding to an optimal chip design.

The SoC design framework is embedded within the SIMA based processor and configured to adapt and implement reinforcement learning techniques. The SoC design framework disclosed in the embodiments herein is designed to reduce the complexity in the decision making process associated with design of SoC circuits. The decisions associated with the designing of SoC circuits are multitude and typically heterogeneous in nature. The SoC design framework of the embodiments herein is configured to generalize the multitude of heterogeneous decisions into a plurality of generalized, homogenous decisions, which are in turn utilized to finalize and implement the design for the SoC circuits. The SoC design framework disclosed in the embodiments herein is designed to utilize a combination of artificial intelligence and reinforcement learning principles to arrive at optimal decisions regarding the design and implementation of SoC circuits.

According to an embodiment herein, a computer-implemented system for designing SoC, includes a first processor configured to create at least one reinforcement learning agent and at least one corresponding reinforcement learning environment, said first processor further configured to assign a reinforcement learning agent ID to said reinforcement learning agent, and a reinforcement learning environment ID to said reinforcement learning environment. The system further includes a first memory module communicably coupled to said first processor, said first memory module configured to store an application-domain specific instruction set (ASI), SoC specification input and a chip database library. The application-domain specific instruction set includes instructions for initializing a chip topology from the SoC specification, the application-domain specific instruction set further configured to create a plurality of domains and a plurality of subdomains for artificial intelligence (AI) setup to generate chip specific graph library, each of said instructions incorporating at least one of said reinforcement learning agent ID and said reinforcement learning environment ID as an operand. The system includes a complex instruction fetch and decode (CISFD) unit communicably coupled to said memory module. The CISFD unit configured to decode at least one of said instructions, and generate a plurality of predetermined threads corresponding to decoded instruction. The CISFD unit still further configured to embed into the predetermined threads, at least one of said reinforcement learning agent ID and reinforcement learning environment ID associated with the decoded instruction. The system includes a second processor configured to initiate an interaction between the reinforcement learning agent and the reinforcement learning agent environment. The second processor includes a plurality of cores, and configured to apply a corresponding instruction onto at least one of a reinforcement learning agent and reinforcement learning environment identified by the reinforcement learning agent ID and reinforcement learning environment ID to map each of the SoC sub domains from the plurality of SoC sub domains to a combination of environment, rewards and actions. The second processor is further configured to generate Q values for each domain using the reinforcement learning agent. The system further includes a second memory module cooperating with said second processor. The second memory module is an on-chip memory, external DRAM, hard disk drive. The second memory module is configured to store the extracted Q values of each domain and subdomain in a hierarchical SMDP structure in a form of SMDP Q table for optimization for planning SoC. According to an embodiment herein, the second processor is further configured to acquire optimal chip architecture for designing SoC using application-domain specific instruction set (ASI). The application-domain specific instruction set are single instruction multiple agents (SIMA) based instructions configured to map reinforcement learning environment to Electronic design automation EDA tools associated with the corresponding AI SoC subdomain. The Electronic design automation (EDA), also referred to as electronic computer-aided design (ECAD), is a category of software tools for designing electronic systems such as integrated circuits and printed circuit boards. The tools, for example tools used for synthesis, simulation, design entry and physical design work together in a design flow that chip designers use to design and analyze entire semiconductor chips. A plurality of reinforcement learning agents are configured to interact with the reinforcement learning environment for a predefined number of times and update Q values, V values, R value, and A value in the second memory module.

In accordance with an exemplary embodiment of the present disclosure, the SIMA type instructions when executed by the reinforcement processor, trigger a reinforcement learning agent to interact with a corresponding reinforcement learning environment and further enable the reinforcement learning agent to explore the reinforcement learning environment and deduce relevant learnings from the reinforcement learning environment. Additionally, SIMA type instructions also provide for the deduced learnings to be iteratively applied onto the reinforcement learning environment to deduce furthermore learnings therefrom.

Further, the SIMA type instructions when executed by the reinforcement learning processor, also enable the reinforcement learning agent to exploit the learnings deduced from any previous interactions between the reinforcement learning agent and the reinforcement learning environment. Further, the SIMA type instructions also enable the reinforcement learning agent to iteratively exploit the learnings deduced from the previous interactions, in any of the subsequent interactions with the reinforcement learning environment. Further, the SIMA type instructions also provide for construction of a Markov Decision Process (MDP) and a Semi-Markov Decision Process (SMDP) based on the interaction between the reinforcement learning agent and the corresponding reinforcement learning environment.

Further, the SIMA type instructions also enable selective updating of the MDP and SMDP, based on the interactions between the reinforcement learning agent and the corresponding reinforcement learning environment. The SIMA type instructions, when executed by the reinforcement learning processor, also backup the MDP and SMDP. Further, the SIMA type instructions when executed on the reinforcement learning agent, enable the reinforcement learning agent to initiate a Q-learning procedure, and a deep-learning procedure and also to associate a reward function in return for the Q-learning and the deep-learning performed by the reinforcement learning agent.

Further, the SIMA type instructions, upon execution by the reinforcement learning processor, read and analyze the 'learning context' corresponding to the reinforcement learning agent and the reinforcement learning environment. Further, the SIMA type instructions determine an optimal Q-value corresponding to a current state of the reinforcement learning agent, and trigger the reinforcement learning agent to perform generalized policy iteration, and on-policy and off-policy learning methods. Further, the SIMA type instructions, upon execution, approximate a state-value function and a reward function for the current state of the reinforcement learning agent. Further, the SIMA type instructions, when executed by the reinforcement learning processor, train at least one of a deep neural network (DNN) and a recurrent neural network (RNN) using a predetermined learning context, and further trigger the deep neural network or the recurrent neural network for approximating at least one of a reward function and state-value function corresponding to the current state of the reinforcement learning agent.

Referring to FIG. 1A, there is shown a block diagram illustrating the components of the system 100 for implementing the tasks/operations pertinent to reinforcement learning. The system 100, as shown in FIG. 1A includes a first memory module 10 (preferably an IRAM). The first memory module stores the application-specific instruction set (ASI), which incorporates the SIMA instructions (referred to as 'instructions' hereafter) for performing predetermined reinforcement learning tasks. The instructions, as described in the above paragraphs, are configured to incorporate either a reinforcement learning agent ID or a reinforcement learning environment ID as the operand. The reinforcement learning agent ID represents a reinforcement learning agent (not shown in figures) trying to achieve a predetermined goal in an optimal manner by the way of interacting with a reinforcement learning environment (represented by reinforcement learning environment ID). Each of the instructions stored in the first memory module 10 are linked to corresponding 'opcodes'. The 'opcodes' corresponding to each of the instructions are also stored in the first memory module 10. Further, the first memory module 10 also stores the reinforcement learning agent ID and reinforcement learning environment ID corresponding to each of the reinforcement learning agents and the reinforcement learning environments upon which the instructions (of the application-specific instruction set) are to be implemented.

The system 100 further includes a Complex Instruction Fetch and Decode (CISFD) unit 12 communicably coupled to the first memory module 10. The CISFD unit 12 fetches from the first memory unit 10, an instruction to be applied to a reinforcement learning agent or a reinforcement learning environment. Subsequently, the CISFD retrieves the 'opcode' corresponding to the fetched instruction, from the first memory module 10. As explained earlier, the instruction fetched by the CISFD unit 12 incorporates at least one of a reinforcement learning agent ID and a reinforcement learning environment ID as the operand. Depending upon the value of the operand, the CISFD unit 12 determines the reinforcement learning agent/reinforcement learning environment on which the fetched instruction is to be implemented.

Subsequently, the CISFD unit 12, based on the 'opcode' and 'operand' corresponding to the fetched instruction, generates a plurality of predetermined threads, namely a 'v-thread', 'a-thread', 'q-thread' and an 'r-thread', corresponding to the fetched instruction. The threads generated by the CISFD unit 12 are representative of the characteristics of either the reinforcement learning agent or the reinforcement learning environment or both, upon which the fetched instruction is executed. The characteristics represented by the predetermined threads include at least the action(s) performed by the reinforcement learning agent at every state, value associated with each state of the reinforcement learning agent, reward(s) gained by the reinforcement learning agent during the interaction with the reinforcement learning environment. In order to associate each of the threads with the corresponding reinforcement learning agent/reinforcement learning environment, the operand of the instruction (the instruction for which the threads are created) is embedded into the v-thread, a-thread, q-thread and r-thread.

In accordance with the present disclosure, the 'v-thread' upon execution determines the 'state-value functions' corresponding to each state of the reinforcement learning agent. The 'state-value functions' indicate the 'value' associated with each of the states of the reinforcement learning agent. Similarly, the 'a-thread' upon execution determines the 'actions' performed by the reinforcement learning agent in every state thereof, and subsequently generates 'control signals', for implementing the 'actions' associated with the reinforcement learning agent. Similarly, the 'q-thread' upon execution determines 'Q-values' which are generated using a state-action function representing the actions performed by the reinforcement learning agent at every corresponding state. Similarly, the 'r-thread' on execution determines the rewards obtained by the reinforcement learning agent for performing a specific action while being in a specific state.

In accordance with the present disclosure, the system 100 further includes a second processor 14 (referred to as 'reinforcement learning processor' hereafter) specifically configured for executing the instructions embodied in the application-specific instruction set (ASI), and for implementing the reinforcement tasks represented by the said instructions to design SoC. The reinforcement learning processor 14 executes the instruction fetched by the CISFD unit 12, by the way of executing the corresponding v-thread, a-thread, q-thread and r-thread. The reinforcement learning processor 14 is preferably a multi-core processor comprising a plurality of processor cores.

According to an embodiment herein, a system with reinforcement learning processor for designing SoC is disclosed. The system includes the first processor or host processor configured to create at least one reinforcement learning agent and at least one corresponding reinforcement learning environment, said first processor further configured to assign a reinforcement learning agent ID to said reinforcement learning agent, and a reinforcement learning environment ID to said reinforcement learning environment. The system further includes a first memory module communicably coupled to said first processor, said first memory module configured to store an application-domain specific instruction set (ASI), SoC specification input and a chip database library. The application-domain specific instruction set includes instructions for initializing a chip topology from the SoC specification, the application-domain specific instruction set further configured to create a plurality of domains and a plurality of subdomains for artificial intelligence (AI) setup to generate chip specific graph library, each of said instructions incorporating at least one of said reinforcement learning agent ID and said reinforcement learning environment ID as an operand. The system includes a complex instruction fetch and decode (CISFD) unit communicably coupled to said memory module. The CISFD unit configured to decode at least one of said instructions, and generate a plurality of predetermined threads corresponding to decoded instruction. The CISFD unit still further configured to embed into the predetermined threads, at least one of said reinforcement learning agent ID and reinforcement learning environment ID associated with the decoded instruction. The system includes a second processor or reinforcement learning processor configured to initiate an interaction between the reinforcement learning agent and the reinforcement learning agent environment. The second processor includes a plurality of cores, and configured to apply a corresponding instruction onto at least one of a reinforcement learning agent and reinforcement learning environment identified by the reinforcement learning agent ID and reinforcement learning environment ID to map each of the SoC sub domains from the plurality of SoC sub domains to a combination of environment, rewards and actions. The second processor is further configured to generate Q values for each domain using the reinforcement learning agent. The system further includes a second memory module cooperating with said second processor. The second memory module is an on-chip memory, external DRAM, hard disk drive. The second memory module is configured to store the extracted Q values of each domain and subdomain in a hierarchical SMDP structure in a form of SMDP Q table for optimization for planning SoC. According to an embodiment herein, the second processor is further configured to acquire optimal chip architecture for designing SoC using application-domain specific instruction set (ASI). The application-domain specific instruction set are single instruction multiple agents (SIMA) based instructions configured to map reinforcement learning environment to Electronic design automation EDA tools associated with the corresponding AI SoC subdomain. A plurality of reinforcement learning agents are configured to interact with the reinforcement learning environment for a predefined number of times and update Q values, V values, R value, and A value in the second memory module.

According to an embodiment herein, the second processor is further configured to create an empty environment corresponding to the reinforcement learning environment ID. The second processor is also configured to create an empty agent within the reinforcement learning environment denoted by the reinforcement learning environment ID. The plurality of reinforcement learning agents are associated to at least one reinforcement learning environment. Further, a training is initiated on the reinforcement learning agent represented by the reinforcement learning agent ID by using exploration instruction. Thereafter, second processor associates the chip topology to a Markov Decision Process (MDP) with HAM constraints, second processor branches the chip topology to a plurality of SMDPs or MDPs. The second processor activates the plurality of SMDPs or MDPS, and wherein the plurality of activated SMDPs or MDPs is terminated on achieving a preset Q-value or a preset objective. Further, the second processor synchronizes the plurality of SMDPs or MDPs after termination. Further, second processor activates a plurality of subdomains at a same level, and wherein the plurality of activated subdomains is terminated on achieving a preset Q-value or a preset objective. The second processor synchronizes the plurality of subdomains after termination; and initiates a physical verification of the plurality of SMDPs or MDPs.

In accordance with the present disclosure, each of the processor cores of the reinforcement learning processor 14 incorporate at least 'four' execution units (FIG. 1A describes a processor core 140 having 'four' execution units 140A, 140B, 140C and 140D). The threads, i.e., v-thread, a-thread, q-thread and r-thread are preferably assigned to individual execution units of a processor core respectively, thereby causing the threads (v-thread, a-thread, q-thread and r-thread) to be executed in parallel (simultaneously). The reinforcement learning processor 14, based on the operand associated with the fetched instruction, determines the reinforcement learning agent or the reinforcement learning environment upon which the threads (i.e., v-thread, a-thread, q-thread and r-thread) are to be executed. In an example, the reinforcement learning processor 14 executes the v-thread, a-thread, q-thread and r-thread on a reinforcement learning agent identified by corresponding reinforcement learning agent ID, and determines at least one 'state-value function', at least one 'action', at least one 'Q-value', and at least one 'rewards corresponding to the reinforcement learning agent identified by the reinforcement learning agent ID.

The 'state-value function', 'action', 'Q-value' and 'reward' thus determined by the reinforcement learning processor 14 are stored in a second memory module 16. In accordance with the present disclosure, the second memory module 16 is preferably bifurcated into at least 'four' memory partitions, namely, an 'a-memory module' 16A, a 'v-memory module' 16B, a 'q-memory module' 16C, and an 'r-memory module' 16D. The 'a-memory module' 16A stores the information corresponding to the actions performed by the reinforcement learning agent (identified by the reinforcement learning agent ID) at every state. The actions are stored on the 'a-memory module' 16A in a binary encoded format.

The 'v-memory module' 16B stores the 'state-value functions' indicative of the value associated with every state of the reinforcement learning agent (identified by the reinforcement learning agent ID) while the reinforcement learning agent follows a predetermined policy. The 'v-memory module' 16B also stores the 'optimal state-value functions' indicative of an optimal state-value associated with the reinforcement learning agent under an optimal policy. Further, the 'q-memory module' 16C stores 'Q-values' which are generated using a state-action function representative of a correlation between the actions performed by the reinforcement learning agent at every state and under a predetermined policy. The 'q-memory module' 16C also stores the 'optimal Q-value' for every state-action pair associated with the reinforcement learning agent, and adhering to an optimal policy. The term 'state-action function' denotes the action performed by the reinforcement learning agent at a specific state. Further, the 'r-memory module' 16D stores the 'rewards' (reward values) obtained by the reinforcement learning agent, in return for performing a specific action while being in a specific state.

Subsequently, the reinforcement learning processor 14 selectively retrieves the 'state-value functions', 'actions', 'Q-values' and 'rewards' corresponding to the reinforcement learning agent (and indicative of the interaction between the reinforcement learning agent and the reinforcement learning environment) from the 'a-memory module' 16A, 'v-memory module' 16B, 'q-memory module' 16C, and 'r-memory module' 16D respectively, and transmits the retrieved 'state-value functions', 'actions', 'Q-values' and 'rewards' to a neural network (illustrated in FIG. 7A) via a corresponding neural network data path 18. Subsequently, the reinforcement learning processor 14 trains the neural network to approximate reward functions that in turn associate a probable reward with the current state of the reinforcement learning agent, and also with the probable future states and future actions of the reinforcement learning agent. Further, the reinforcement learning processor 14 also trains the neural network to approximate state-value functions that in turn approximate a probable value for all the probable future states of the reinforcement learning agent.

In accordance with an embodiment of the present disclosure, the reinforcement learning processor is further configured to train the reinforcement learning agents using application-domain specific instruction set (ASI), wherein the application-domain specific instruction set are single instruction multiple agents (SIMA) based instructions, and wherein a plurality of agents are configured to work on a copy of same environment and work on mutually different policies in parallel, and wherein the plurality of agents is selected and merged in a synchronous or asynchronous manner.

In accordance with the present disclosure, the CISFD unit 12 is configured to receive the SIMA type instructions fetched from the first memory module 10 and identify the 'opcode' corresponding to the received instruction. Subsequently, the CISFD unit 12 determines and analyzes the 'operand' (either the reinforcement learning agent ID or the reinforcement learning environment ID) and identifies the corresponding reinforcement learning agent or the reinforcement learning environment upon which the instruction is to be executed. Subsequently, the CISFD unit 12 converts the instruction into 'a-thread', 'v-thread', 'q-thread' and 'r-thread' (collectively referred to as a 'thread block'). The CISFD unit 12 also embeds the corresponding reinforcement learning agent ID or the reinforcement learning environment ID, so as to associate the instruction (received from the first memory module 10) with the corresponding thread block and the corresponding reinforcement learning agent/reinforcement learning environment. Subsequently, each of the threads, i.e., the 'a-thread', 'v-thread', 'q-thread' and 'r-thread' are assigned to respective execution units of a processor core of the reinforcement learning processor 14. In this case, each of the threads are simultaneously executed by 'four' execution units of the processor core.

In accordance with an exemplary embodiment of the present disclosure, if the CISFD unit 12 fetches the instruction 'optval agent ID', then the CISFD unit 12 decodes the instruction to determine the 'opcode' corresponding to the instruction, and subsequently determines the function to be performed in response to the said instruction, based on the 'opcode'. Subsequently, the CISFD unit 12 triggers the creation of the 'a-thread', 'v-thread', 'q-thread' and 'r-thread' corresponding to the instruction 'optval', and triggers the reinforcement learning processor 14 to execute the 'a-thread', 'v-thread', 'q-thread' and 'r-thread' as predetermined Arithmetic Logic Unit (ALU) operations. The CISFD unit 12 instructs the reinforcement learning processor 14 to execute the 'a-thread', 'v-thread', 'q-thread' and 'r-thread' on the reinforcement learning agent/reinforcement learning environment identified by the 'operand' (reinforcement learning agent ID/reinforcement learning environment ID). The resultant of the execution of the threads are stored in 'a-memory module' 16A, 'v-memory module' 16B, 'q-memory module' 16C, and 'r-memory module' 16D respectively.

The system 100 further includes a (scalable) scheduler module 20 that provides the second processor 14 with selective access to the neural network data paths 18. The scheduler module 20 also controls the operations of a Digital Signal Processing (DSP) unit 26, a Memory Management Unit (MMU) 28, and the software driver modules ('Hostif' drivers) 30 that facilitates communication between the reinforcement learning processor 14 and a first processor 24 (referred to as 'host processor' hereafter). Further, the scheduler module 20 allocates memory space in each of the aforementioned memory modules (i.e., 'a-memory module' 16A, 'v-memory module' 16B, 'q-memory module' 16C, and 'r-memory module' 16D) for the results of the execution of the 'a-thread', 'v-thread' 'q-thread' and 'r-thread' to be written thereto. Additionally, the scheduler module 20 is also configured to selectively prioritize the activities (exploration and exploitation) of predetermined reinforcement learning agents. Further, the scheduler module 20 also prioritizes the activities (exploration and exploitation) performed upon predetermined reinforcement learning environments. Additionally, the scheduler module 20 selectively prioritizes the interaction between the reinforcement learning processor 14 and the host processor 24.

Referring to FIG. 1 again, the 'a-memory module' 16A stores information corresponding to the actions performed by the reinforcement learning agent. The 'v-memory module' 16B stores the 'state-value functions' indicative of the value associated with every state of the reinforcement learning agent, under a predetermined policy. The 'v-memory module' 16B also stores the 'optimal state-value function' indicative of an optimal value associated with every state of the reinforcement learning agent under an optimal policy. Further, the 'q-memory module' 16C stores 'Q-values' which are generated using a state-action function which represents a correlation between the actions performed by the reinforcement learning agent at every state and under a predetermined policy. The 'q-memory module' 16C also stores the 'optimal Q-values' for every state-action pair associated with the reinforcement learning agent, and adhering to an optimal policy. The term 'state-action pair' denotes the action performed by the reinforcement learning agent at a specific state. Further, the 'r-memory module' 16D stores the 'rewards' (reward values) obtained by the reinforcement learning agent, in return for performing a specific action while being in a specific state.

According to an embodiment, the system includes a neural network which is triggered via a corresponding neural network data path, and the determined actions, state-value function, Q-value and reward value are transferred to the neural network for analysis. Subsequently, the neural network is trained using the determined actions, state-value function, Q-value and reward value, to approximate a value-function and a reward function corresponding to either a current state or a future state of the reinforcement learning agent.

Shown herein below is a table incorporating a non-exhaustive, exemplary list of instructions for performing predetermined reinforcement learning operations.

| Instruction | Opcode (8 bit) | Operand (8, 16, 32, 64 bit) | description |
| --- | --- | --- | --- |
| abs | 00000000 | INT32 | absolute |
| add | 00000001 | 2x INT32 | Add two 32 bit intergers |
| vapproxlin | 00000010 | AGENT ID 32 bit | Value function approximation using 32 bit agent ID using linear method |
| and | 00000011 | 2x INT32 | Logical ADD of 2 32 bit integers |
| brkpt | 00000100 | Nil | Break point |
| cls | 00000101 | Nil | |
| div | 00000110 | 2xFLOAT32 | Division on 32 bit floating point |
| mv | 00000111 | regA, regB | Move content from RegA register to RegB |
| rmw | 00001000 | Memory mapped offset | Read modify right |
| nn | 00001001 | Neural net ID (32 bit) | Call Neural net, is used as a function to feed data and start training |
| extoptk | 00001010 | 32 bit Agent ID | Exploitation only mode for Agent K |
| dwnwdnnk | 00001011 | Neuralnet ID (32 bit), mem segment ID (32 bit) | Download weights for neural net k |
| optval | 00001100 | Agent ID (32 bit) | Optimal value function for current state of MDP of the Agent k |
| explrk | 00001101 | Agent ID (32 bit) | Enter into exploration mode agent k |
| explrall | 00001110 | Env ID (32 bit) | Enter into Exploration mode for all agent in a given env ID |
| vapproxgd | 00001111 | Agent ID (32 bit) | Approximate value function of agent k |
| mul | 00010000 | 2x Float 32 | Multiplication of 2 32 bit floating point, result is 64 bit register |
| not | 00010001 | INT 32 | Not of 32 bit integer |
| nor | 00010010 | INT 32 | Nor operation on 32 bit integer |
| or | 00010011 | INT 32 | OR operation on 32 bit integer |
| xor | 00010100 | INT 32 | XOR operation on 32 bit integer |
| dnn | 00010101 | Dnn ID (32 bit) | Call deep neural network with ID k |
| dwnctxk | 00010110 | Core Id (32 bit), memoffet | Download context to core ID k |
| intrDNNk | 00010111 | Dnn ID (32 bit) | Interrupt DNN with ID k |
| plank | 00011000 | Agent ID (32 bit) | Plan for agent k (algorithm for planning hardcoded currently) |
| policygradk | 00011001 | Agent ID (32 bit) | Perform Policy gradient on Agent k |
| bkpk | 00011010 | Agent ID (32 bit) | Back up Agent k (currently on-policy trajectory based backup is supported) |
| vapproxNNk | 00011011 | Agent ID (32 bit) | Value function approximation using DNN for agent ID k |

-continued

| Instruction | Opcode (8 bit) | Operand (8, 16, 32, 64 bit) | description |
|---|---|---|---|
| vapproxtilek | 00011100 | Agent ID (32 bit) | Value function approximation using tilecoding for agent ID k |
| politerk | 00011101 | Agent ID (32 bit) | Policy iteration thr agent ID k |
| valiterk | 00011110 | Agent ID (32 bit) | Value iteration for Agent ID k |
| fetchq | 00011111 | Agent ID (32 bit) | Fetch q values for Agent ID k from Q memory. Q value for last state will be fetched, with stack based access |
| fetchv | 00100000 | Agent ID (32 bit) | Fetch q values for Agent ID k from V memory. V value for last state will be fetched, with stack based access |
| dmar | 00100001 | DMA length (16 bit), DMA start offset (15 bit), direction (1 bit) | DMA on R memory to or from External memory when LSB set to '0', it is from external memory, else it is to external memory |
| dmaa | 00100010 | DMA length (16 bit), DMA start offset (15 bit), direction (1 bit) | DMA on A memory to or from External memory, when LSB set to '0', it is from external memory, else it is to external memory |
| upctx | 00100011 | Context ID (16 bit), upload address 16 bit | Upload context ID k to location specified in location ID |
| flushdnnk | 00100100 | DNN ID (32 bit) | Flush DNN ID k, clear all weights of DNN |
| indrl | 00100101 | | |
| Td | 00100110 | Agent ID (32 bit) | Temporal Difference on agent ID k for an episode |
| dmav | 00100111 | DMA length (16 bit), DMA start offset (15 bit), direction (1 bit) | DMA on V memory to or from External memory, when LSB set to '0', it is from external memory, else it is to external memory |
| dmaq | 00101000 | DMA length (16 bit), DMA start offset (15 bit), direction (1 bit) | DMA on Q memory to or from External memory, When LSB set to '0', it is from external memory, else it is to external memory |
| ql | 00101001 | Agent ID (32 bit) | Initiate Q learning for Agent ID k for an Episode |
| srl | 00101010 | | |
| sra | 00101011 | | |
| gpi | 00101100 | Agent ID (32 bit) | Generic Policy Iteration on Agent k |
| gpiall | 00101101 | Env ID (32 bit) | Generic policy iteration on all Agents in env k |
| modelenv | 00101110 | Agent ID (32 bit) | Model environment for agent k |
| modelenvall | 00101111 | Env ID (32 bit) | Model environment for all agents in env k |
| traindnnk | 00110000 | Training context ID (32 bit) | Train deep neural network, with training context k |
| upwdnnk | 00110001 | Training context ID (32 bit) | Upload or backup of trained deep neural network with training context Id k |
| drlk | 00110010 | Agent Id (32 bit) | Deep rl on agent k |
| tdlk | 00110011 | Agent ID (28 bit), Lamda length (4 bits) | TD Lambda on agent k |
| fetchr | 00110100 | Agent ID (32 bit) | Fetch r values for Agent ID k from R memory. R value for last state will be fetched, with stack based access |
| optq | 00110101 | Agent ID (32 bit) | Optimal q value of current state of MDP of agent k |
| crtenv | 00110110 | Env ID (32 bit) | Creates empty env with env ID k |
| crtagent | 00110111 | Env ID (32 bit) | Create an empty agent in an env with ID k and assign 32 bit ID to agent |
| assocrewardk | 00110111 | Agent ID (32 bit), reward function ID (8 bit) | Associate reward function to Agent ID k. Each agent can have upto 32 reward functions. Most reward functions are programmable and downloaded from host and when reward function point to dNN, it can be |

| Instruction | Opcode (8 bit) | Operand (8, 16, 32, 64 bit) | description |
| --- | --- | --- | --- |
| | | | trained by data provided by host. Reward function resides in memory, which can be retrieved to combine |
| intrctenvk | 00111000 | Agent ID(32 bit), N (32 bit) | Agent k to Interact with env for N times and update Q, V, A and R mem |
| rdagentctx | 00111001 | Env ID (32 bit), Agent ID (32 bit) | Reads the agent context and stores it into external memory or DRAM |
| rdenvctx | 00111010 | Env ID (32 bit) | Reads env context and stores it into external memory or DRAM |

According to an embodiment herein, each of the AI SoC sub domains are mapped to combination of reinforcement learning environment, corresponding observation and actions onto the reinforcement learning processor, using the application specific instructions such as 'crtenv', 'cragent' and 'assocrewardk'. Further, the application specific instructions, for example 'intrctenvk' is configured to enable an agent 'k' to interact with the environment for a predetermined number of times (N times) to update values of 'Q', 'V', 'A', and 'R' in the second memory.

Figure 1B:
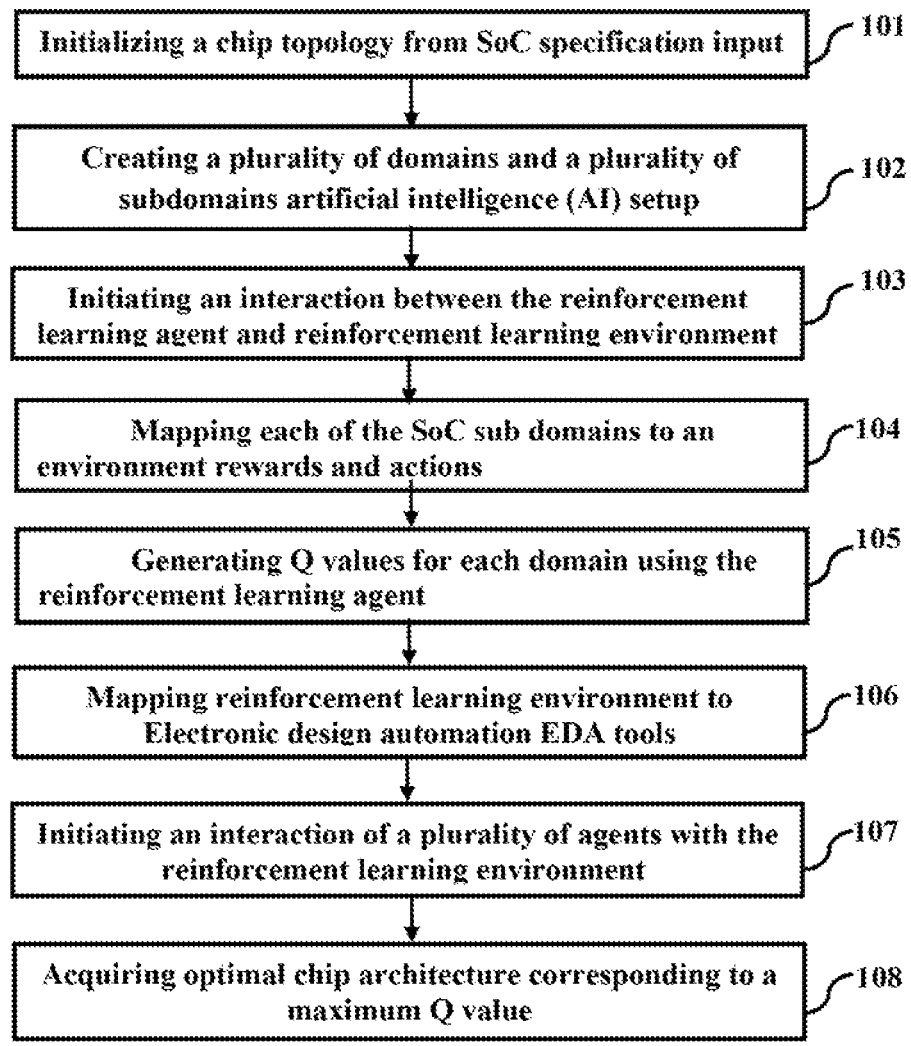
FIG. 1B illustrates a flowchart explaining a method for designing SoC by synchronizing a hierarchy of SMDPs, according to an embodiment herein.

FIG. 1B illustrates a flowchart explaining a method for designing SoC by using a reinforcement learning processor depicted in FIG. 1A, according to an embodiment herein. According to the embodiments herein, the entire SoC circuit along with the processor, digital design, circuit design process is represented in the form of a hierarchical model (with emphasis on optimality) subsequent to implementation of reinforcement learning experiments.

The method involves receiving a SoC specification input from a first memory module. Further, the chip design (of SoC) is initialized by extracting details regarding chip, chip skeleton, clock, Input outputs, partitions that are retrieved from the received SoC specification input and a chip database library. Subsequently, a plurality of domains and a plurality of subdomains is created by artificial intelligence (AI) setup in form of Markov Decision Process (MDP), Semi Markov Decision Process (SMDP)s, Hierarchical Abstract Machines (HAM)s and MAX-Q Q using application specific instruction set to generate chip specific graph library (103). The artificial intelligence setup comprises a combination of reinforcement learning (AI) agent, a reinforcement learning environment, and a task. The AI setup is created using application specific instructions retrieved from a first memory module. Thereafter, an interaction is initiated between the reinforcement learning agent created and the reinforcement learning environment using the application specific instructions. Each of the SoC sub domains from the plurality of SoC sub domains is mapped to a combination of environment, rewards and actions by a second processor. Mapping is performed on executing an instruction with a reinforcement learning environment ID by the second processor. The Q values for each domain are generated using the reinforcement learning agent. The AI agent is configured to interact with AI environment through task to extract Q values for each domain. Thereafter, the reinforcement learning environment is mapped to respective Electronic design automation EDA tools associated with the corresponding AI SoC subdomain. Sequentially, an interaction of a plurality of agents is initiated with the reinforcement learning environment for a predefined number of times and further Q value, V value, R value, and A value is updated in the second memory module. Thereby, an optimal chip architecture for designing SoC is acquired using application-domain specific instruction set (ASI). The optimal chip architecture corresponds to a maximum Q value of a top level in a SMDP Q table.

According to an embodiment herein, the Initialization of the SoC chip design flow includes library initialization. In Library initialization process, standard libraries like technology libraries from foundry, standard interface IP from AI SOCD database, processor IPs from database and other standard IPs which are reused are loaded into chip database. These libraries are pulled together into chip database after parsing the SoC specification input. The Soc specification input is at least one of a specification of the chip or a database which represents the previous chip plus the change in description in text or xml format. The pulled in libraries and the specific SoC specification or database provide an IO, chip skeleton, relevant IPs and partition the chip.

According to an embodiment herein, an empty environment corresponding to the reinforcement learning environment ID is created. Further, an empty agent within the reinforcement learning environment denoted by the reinforcement learning environment ID is created. Thereafter, the plurality of reinforcement learning agents is associated to at least one reinforcement learning environment. Subsequently, training is initiated on the reinforcement learning agent represented by the reinforcement learning agent ID by using exploration instruction. Further, the chip topology is associated to a Markov Decision Process (MDP) with HAM constraints. The chip topology is branched to a plurality of SMDPs or MDPs. The plurality of SMDPs or MDPS are activated. Further, the plurality of activated SMDPs or MDPs is terminated on achieving a preset Q-value or a preset objective. The plurality of SMDPs or MDPs are synchronized after termination. A plurality of subdomains at a same level is activated. Further, the plurality of activated subdomains is terminated on achieving a preset Q-value or a preset objective. Thereafter, the plurality of subdomains are synchronized after termination.

A physical verification of the plurality of SMDPs or MDPs is initiated. The extracted Q values of each domain and subdomain is stored in a hierarchical SMDP structure in a form of SMDP Q table in a big data database for optimization for planning SoC. Subsequently, a maximum Q value for each domain is determined through an initialization process of any one of MDPs, SMDPs, and a hierarchy of MDPs. Thereafter, an optimal chip architecture is estimated corresponding to a maximum Q value of a top level in the SMDP Q table. Thus, an optimal chip architecture is acquired for designing SoC. Thereafter, the optimal chip architecture is stored in a database for learning and inference. The desired SoC configuration is generated and optimized based on the optimal chip architecture and the generated chip specific graph library. The step of acquiring an optimal chip architecture from the maximum Q value comprises deriving optimal policies associated with the optimal Q value, and executing actions associated with the derived optimal policy.

According to an embodiment herein, a backup of each of the plurality of subdomains hierarchically through Hierarchical Deep SMDP network (HDSN). The step of storing the extracted Q values comprises storing Q values in a Q table for leaf level MDPs and options macros.

According to an embodiment herein, in order to achieve the preset Q-value the reinforcement learning techniques is executed and terminated. The reinforcement learning techniques is executed and terminated when Q value converges below a preset threshold value for each domain or when a change of Q value is reduced below the preset threshold value for each SoC domain. Alternatively, the reinforcement learning techniques is executed and terminated, when a predefined number of episodes is completed for each specific domain. According to an embodiment herein, the reinforcement learning techniques is executed and terminated, when a predefined target performance or predefined exit state is reached for each specific domain. The reinforcement learning techniques is executed and terminated, when a predefined hierarchically optimal state for each domain is achieved.

According to an embodiment herein, the multi-objective AI agents is configured to feedback the inferences into the graph database and a database which hold Q-values and neural network weights. The database which stores the inferences/learnt data is used for "transfer learning" process. The "Transfer learning" process is defined as a process in which the learnt task is transferred to similar tasks which are not learnt, but are estimated using transferred learning means, when a set of logically close tasks are learnt already. Examples of multi objective Agent include but not limited to SoC Noc agent, SoC Power agent, SoC Physical Agent, SoC multiprocessor agent, SoC security agent and SoC clock agent. The multi-objective AI agent (hereafter referred to as AI agent) is configured to generate Q values for each domain. The AI agent is configured to interact with AI environment through AI task to extract Q values for each domain.

According to an embodiment herein, the extracted Q values of each domain and subdomain in a hierarchical SMDP structure are stored hierarchically in a form of SMDP Q table in a big data database for optimization of SoC design planning process. In order to extract Q value, reinforcement learning process is initiated for each domain. The domain is any one of a NoC generation, Power optimization, Interface integration, Logic Verification, Logic synthesis, Pre layout timing closure, Physical design, post Layout timing closure and Physical verification.

Figure 2:
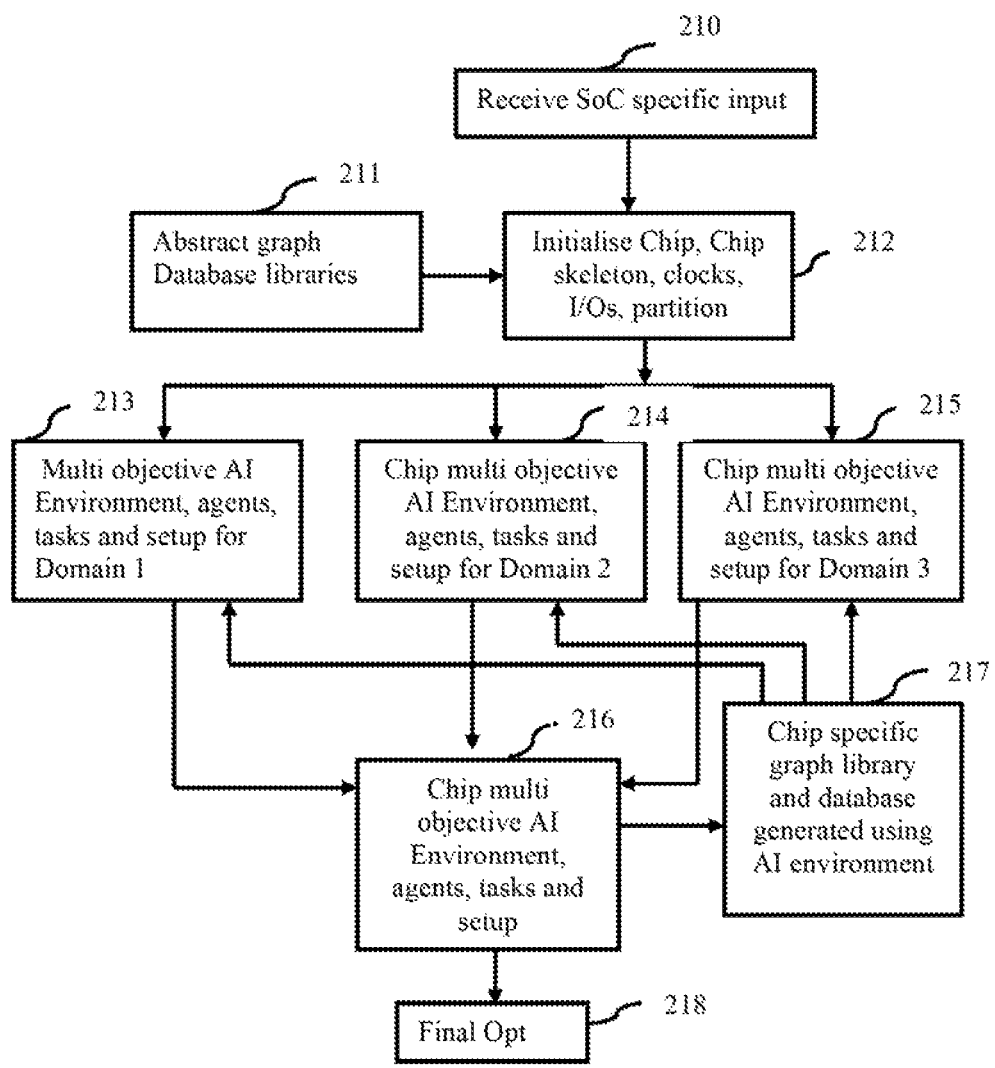
FIG. 2 illustrates a flowchart explaining a method for SoC design using an AI driven design setup with hierarchical multi-objective AI, according to an embodiment herein.

FIG. 2 illustrates a flowchart explaining a method for SoC design using an AI driven design setup with hierarchical multi-objective AI, according to an embodiment herein. The SoC specification input is received (210). An abstract graph database libraries are created to store details regarding a chip design technology and standards involved and required for a chip designing process. Further a chip design knowledge library and a generic hardware and software libraries are also created and maintained (211). The details regarding chip, chip skeleton, clock. Input outputs, partitions that are retrieved from the received SoC specification input and a chip database library or graph database library. A chip design (of SoC) is initialized based on the extracted details regarding chip, chip skeleton, clock, Input outputs, partitions that are retrieved from the received SoC specification input and a chip database library or graph database library, (212). After initialization, AI are setup for various domains in the form of MDPs, SMDPs, HAMs and MAX-Q to further optimize and generate desired SoC configuration. The AI setup represents a Multi objective AI agent. The AI setup for a domain includes multi-objective AI agents with environment, and a plurality of tasks. The AI setup for a domain is executed and repeated for a plurality of domains such as first domain, second domain, and a third domain (213, 214, 215). Then a multi objective AI environment, agents and tasks are set up by compiling the data received from the AI set up for the plurality of domains (216). The chip specific graph library and database is generated using AI environment based on the output data received from a multi objective AI environment, agents and tasks. Further, data stored in the chip specific graph library and database is fed to the AI set up for the plurality of domains in a feedback loop (217). The multi-objective AI agent for a chip is configured to generate Q values for each domain. The AI agent is configured to interact with AI environment through task to extract Q values for each domain. Subsequently, the extracted Q values of each domain and subdomain in a hierarchical SMDP structure are stored hierarchically in a form of SMDP Q table in a big data database for optimization of SoC design planning process. Further an optimal chip architecture is obtained from the optimal Q value (218).

According to an embodiment herein, a combination of HAMs, options and Max-Q learning is used to achieve end to end SoC design framework. Max-Q learning involves categorizing the entire SoC design into a hierarchy of SMDPs, for acquiring a Q value or learning a solution simultaneously across the plurality of SMDPs. In the Max-Q learning process, the core SMDP □ is divided into a plurality of sub tasks {M0, M1, M2, M3, . . . MN}, Solving for M0, solves the entire M. Instead of classic definition of Max-Q, where set M are tasks, they are recursive Max-Q, with HAM like constraints according to the embodiments herein. Each one of M1, M1, M2, . . . MN represents another Max-Q recursively.

According to an embodiment herein, a relation between a lower level SMDP, MDPs and options macro Q values is determined using a Deep Neural Network, when Q values of the upper level in the Q tables are calculated. The lower level SMDP, MDPs and options macro Q values are related to Q values of the upper level in the Q tables. The Deep neural network is selected from a group consisting of a recurrent network, convolutional network, LSTM, GANs and hierarchy of these networks. Further, a Hierarchical Deep SMDP Network (HDSN) is trained for acquiring an optimal value of weights for estimating a relationship function between the pluralities of Q values in the Q tables. The optimal values of weights are obtained by training the neural network. The optimal values are used to determine a process of estimating higher level Q values as a function of lower level Q values in a hierarchical RL setups. The HDSN is further trained or employed to determine a synchronization mechanism between SMDPS at the same level in the hierarchical RL implementation, by determining an appropriate level of threshold Q values to terminate one Semi Markov Decision Process (SMDP) and start another SMDP in tandem.

According to an embodiment herein, each of the SoC domains, i.e., Network On Chip (NoC) generation, power optimization, interface integration, logic verification, logic synthesis, pre layout timing closure, physical design, post layout timing closure and physical verification, are configured to implement (execute) an algorithm, such as, greedy algorithm or a tuned greedy algorithm, to balance the exploitation and exploration thereof. Subsequently the learning is estimated based on the number of inferences drawn from each SoC domain, when the Q values converge, or when a predetermined number of experiments are completed, or predetermined Quality of Results (QoR) standards are met. Corresponding new policies (which are a resultant of learning) for mapping 'state' to 'action' are devised and stored in domain specific databases. New policies learnt in a particular domain are optimized and combined/iterated with the policies learnt in other relevant domains, and hierarchically relevant, optimal policies are generated. Typically, new policies learnt in one domain are optimized and iterated with the policies learnt in other AI SoC domains to derive a context and to obtain hierarchically optimal, multi-domain wise, and sub domain wise optimal policies. Such hierarchically relevant, optimal policies are generated based on at least one of policy based methods, value based methods and actor-critic method of reinforcement learning. The learning methods implemented across SoC domains include DQN, linear functions, windowing functions, regression functions, and value function approximation. Hierarchically optimal and individually optimal policies are stored in the database in the form of equations, functions, SW, options macros to be reused and referred in future learning applications of all AI SoC domains and sub domains.

According to an embodiment herein, the model of environment along with options are constructed for each SoC domains and the corresponding sub domains, using the interaction with the AI environment, and in line with the accuracy required for each domain and sub domain. Supervised Reinforcement Learning principles are utilized for constructing a training model for each SoC domain and sub domain. The training model is any one of a lookup table model, linear expectation model, linear Gaussian model, Gaussian process model or any other similar deterministic or stochastic model that is designed or configured to model the MDP, SMDP and option macros together.

Figure 3:
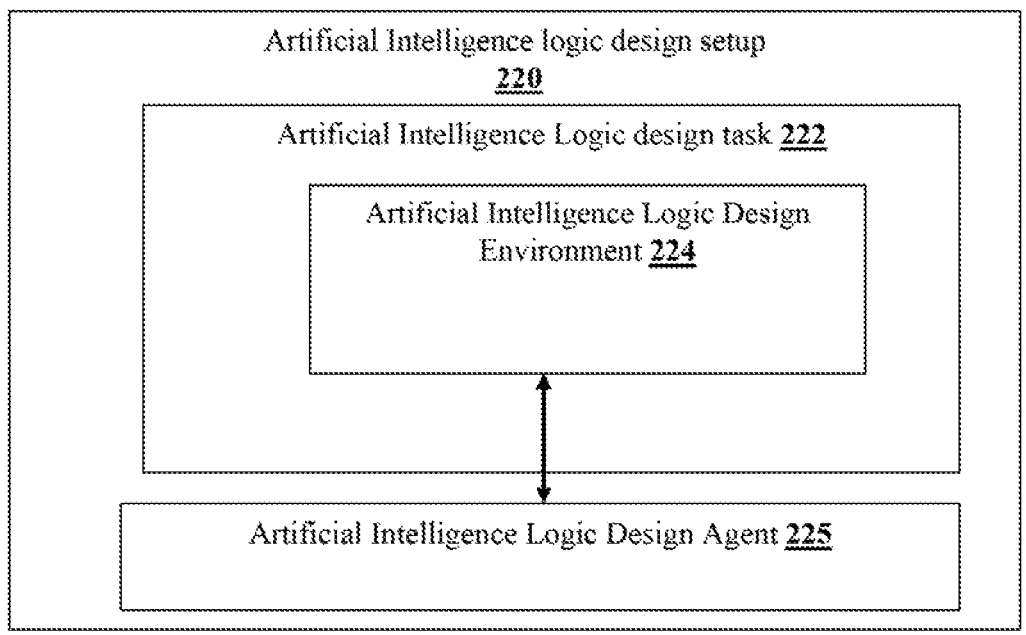
FIG. 3 illustrates a block diagram of an Artificial intelligence (AI) logic design set up for each domain and subdomain in the SoC design framework, according to an embodiment herein.

FIG. 3 illustrates a block diagram of an Artificial intelligence (AI) logic design set up for each domain and subdomain in the SoC design framework, according to an embodiment herein. The Artificial intelligence (AI) logic design set up for each domain and subdomain in the SoC design framework is configured to execute a hierarchical Reinforcement Learning (RL) process or technique using options, MAXQ framework, HAM and any other similar techniques. The Markov Decision Process (MDP) is derived for the main SoC design initially, with the MDP executing the hierarchical tasks. The domain specific Q-values or neural weights are utilized to extract Markov Decision Process (MDP) or Semi Markov Decision Process (SMDP) or option macros or HAM or Max-Q values. Subsequently, the extracted values are stored in domain-specific databases. The extracted SMDPs or MDPs, HAMs or option macros or Max Q-values are utilized to generate inferences pertinent to SoC circuit design, which are in turn loaded on a domain specific Artificial Intelligence setup, thereby initiating an interaction between the inferences and generating an Optimal Chip Architecture (OCA).

With respect to FIG. 3, an artificial intelligence logic design setup 220 comprising an artificial intelligence logic design task 222 and an artificial intelligence logic design agent 225. The Artificial intelligence (AI) design task 222 comprising an artificial intelligence logic design environment 224 is configured to interact with the AI logic design agent 225, to make observations, initiate appropriate actions and subsequently receive rewards for the (performed) actions. The AI logic design agent 225 is designed as a learner module to learn from the interactions with the AI logic design environment 224. The AI logic design agent 225 is configured to perform various actions in the AI environment 224 to acquire or collect observations and rewards from the AI logic design environment 224 for the executed/performed actions/operations.

Figure 4:
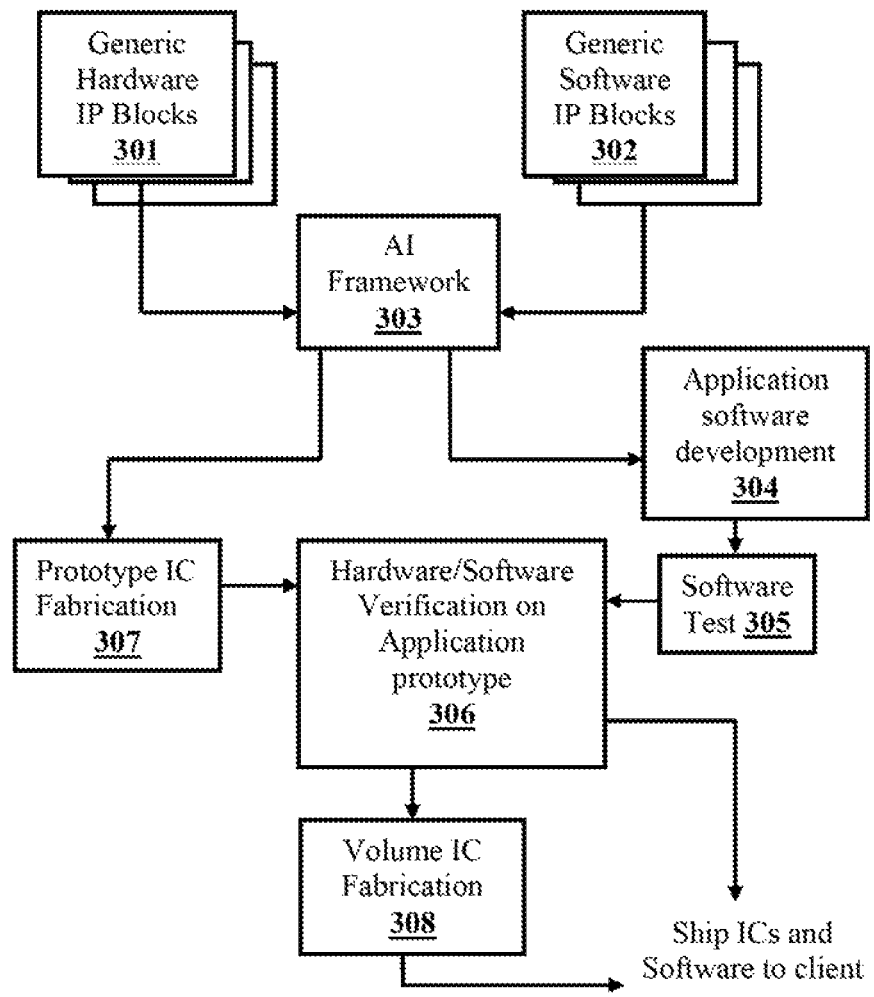
FIG. 4 illustrates a functional block diagram of an AI framework implemented in in the SoC design framework, according to an embodiment herein.

FIG. 4 illustrates a functional block diagram of an AI framework implemented in the SoC design framework, according to an embodiment herein. With respect to FIG. 4, the AI framework 303 for chip design process receives input from a generic hardware IP block 301, generic software IP block 302. The AI framework is configured to provide optimal chip design. The optimal chip design is provided for Application software development 304 and software testing 305. Further, the optimal chip design undergoes hardware/software verification on the application prototype 306. The optimal chip design is provided for prototype IC fabrication 307. After verification, the optimal chip design is sent for volume IC fabrication 308.

Figure 5:
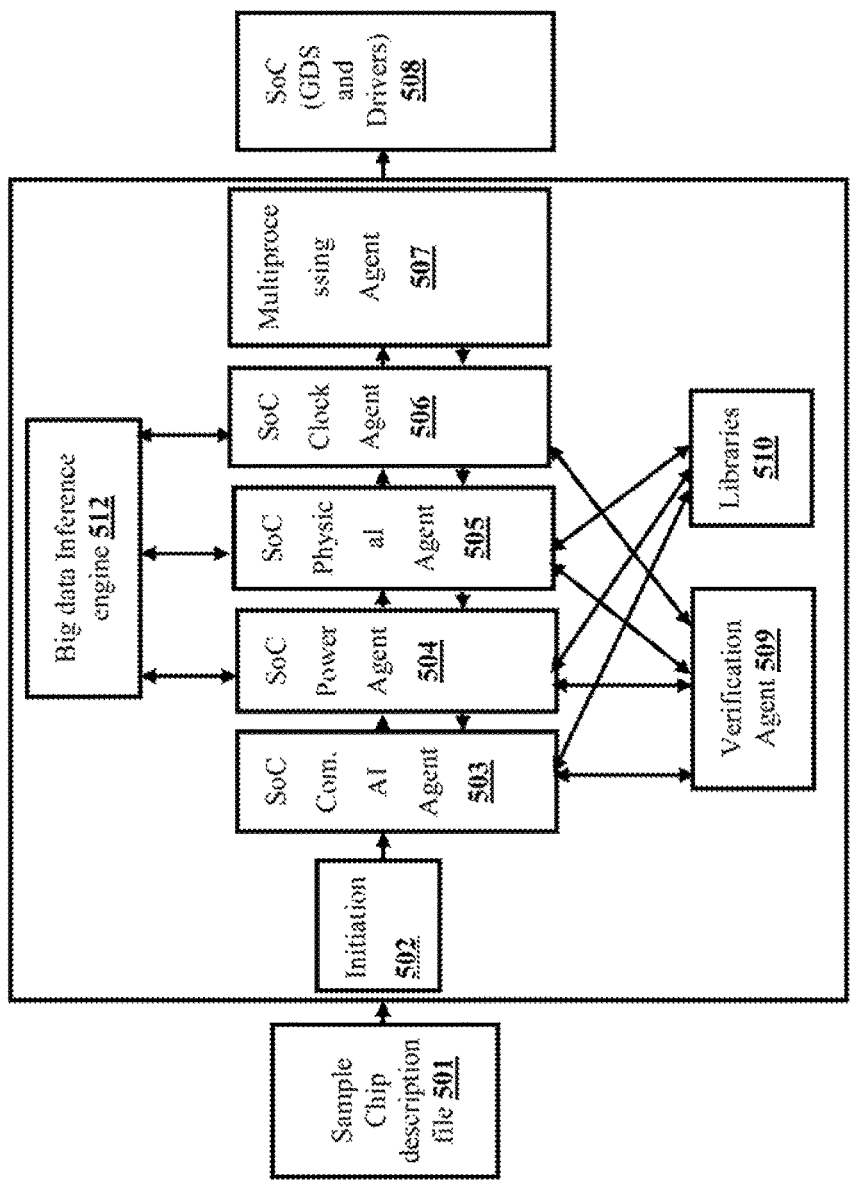
FIG. 5 illustrates a block diagram of an AI framework configured for hierarchical reinforcement learning, according to an embodiment herein.

FIG. 5 illustrates a block diagram of an AI framework configured for hierarchical reinforcement learning, according to an embodiment herein. With respect to FIG. 5, the multi objective AI is Multi objective reinforcement learning agent is designed and configured to learn from an interaction with environment based on the inputs received from the sample chip description file 501 after performing an initialization process 502. The example of Chip multi objective Agent includes but not limited to SoC Noc agent 503. SoC Power agent 504, SoC Physical Agent 505, SoC multiprocessor agent 507, SoC security agent and SoC clock agent 506. AI Framework is so modular in design that a plurality of similar agents is added and plugged them to AI environment and big data database called alpha DB. A Big data inference engine 512 is configured to interact with the plurality of Multi objective reinforcement learning agents 503, 504, 505, 506, 507 to receive inferences for storing into libraries 510 after performing a verification process with a verification agent 509. The output of the reinforcement learning agents are fed to GDS (Graphic Database System) and drivers 508 for planning SoC design.

According to an embodiment herein, the AI frame work comprises SoC Communication and Network on a Chip (NoC) module for connecting a plurality of blocks to one another thereby establishing connection and integration of SoC. The NoC is implemented using a SoC communication AI agent 503.

According to an embodiment herein, the SoC Power optimization module is loaded with techniques for optimizing various power components of the SoC such as leakage and dynamic power and decreasing effects of ageing in hardware due to electron migration on hardware performance using a SoC Power Agent 504.

According to an embodiment herein, SoC clocking module is a domain for clock design of entire SoC, and involves global and local optimization of clocking using a SoC clock Agent 506. This also involves estimating and clock tree optimization.

According to an embodiment herein, SoC Placement and Floor plan is arrived at optimally. SoC Placement and Floor plan includes placement of logic blocks according to reinforcement learnt algorithms and policy. SoC Placement and Floor plan includes power Island creation but is not limited to coming up with policies to optimize timing and power through placement.

According to an embodiment herein, SoC Physical design is carried out, by mapping logical design onto physical libraries of cells which contains information like power, physical layout of transistors, physical delay format and physical power routing using a SoC Physical Agent 505.

According to an embodiment herein, SoC logic verification module is configured to verify chip logic using verification agent 509. The verification process involves using various verification process and collecting metrics for reporting bugs to improve quality of SoC and provide confidence in functionality of SoC.

According to an embodiment herein, SoC physical Verification module is designed to verify the physical implementation of the SoC using verification agent 509. The verification process involves a verification of LVS Vs DRC, post layout timing, routing, IR drop, Power feature correctness, Electric rule check. Further, various policies are explored in this domain to provide optimal tradeoff for physical design (of the SoC circuit) considering all these factors.

According to an embodiment herein, SoC timing module is designed for executing pre-layout and post-layout timing closure. Timing closure involves taking particular actions and policies like solving setup time and hold time, assigning false paths.

According to an embodiment herein, SoC DRC (Design Rule check), SoC ERC (Electric Rule check) are designed and configured to learn, apply and plan ERC and DRC closure policies using deep reinforcement learning techniques.

According to an embodiment herein, packaging related policies and actions are learnt in a SoC Packaging process. The policies related to substrate design, pin-muxing, padding, power ball assignments, possible PCB load on I/O pins and the like. Policies for selecting type of packages are also learnt at the end of all tasks in this domain.

Figure 6:
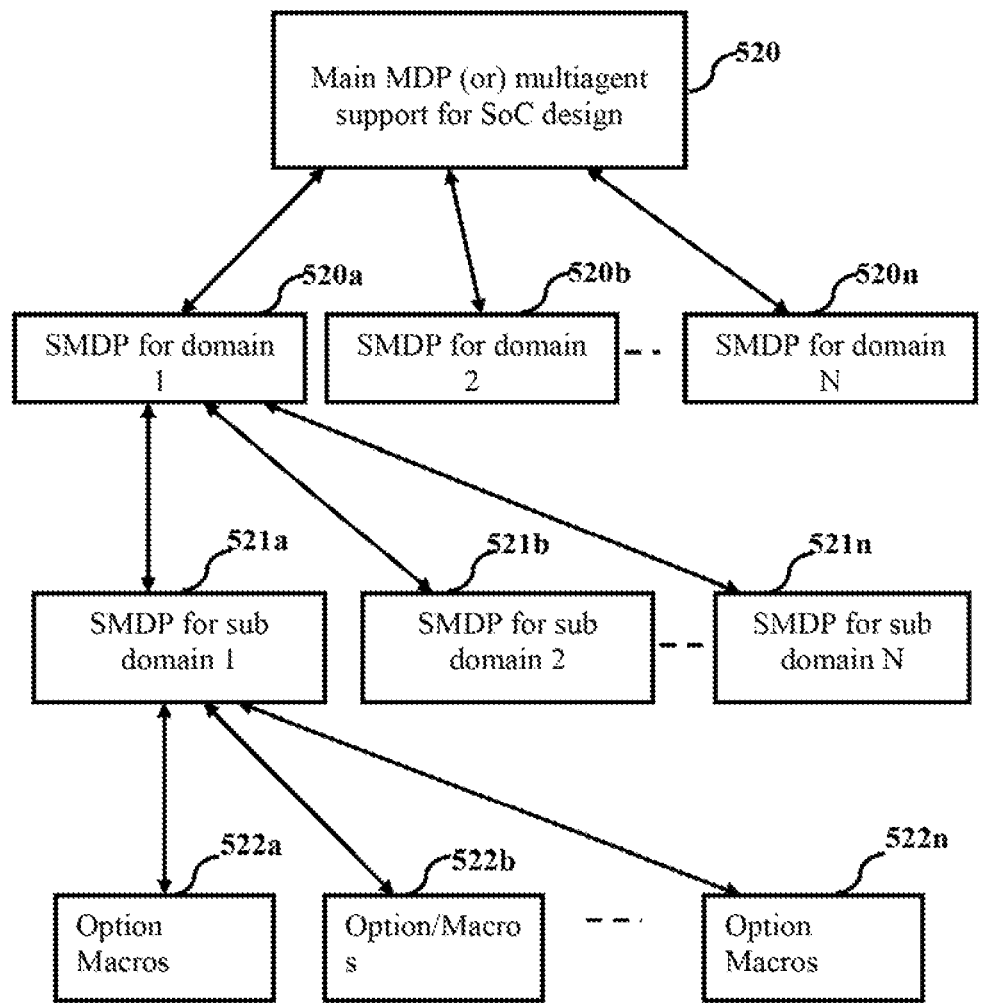
FIG. 6 illustrates a flowchart explaining an interaction process between main MDP and SMDP in SoC design framework, according to an embodiment herein.

FIG. 6 illustrates a flowchart explaining an interaction process between main MDP and SMDP in SoC design framework, according to an embodiment herein. With respect to FIG. 6, the AI framework is configured to perform hierarchical Reinforcement Learning (RL) process using MDP, options, MAXQ framework, HAM and any other similar techniques. The Markov Decision Process (MDP) is derived from the SoC design specification initially. Since, SoC design requires continuous tasks for long time without making decisions, Semi Markov Decision Process (SMDP) is used rather than MDP. The main MDP or multiagent support for Soc design is created (520). The Main MDP is divided into a plurality of SMDPs that correspond to a plurality of domains in SoC design (520*a*, 520*b*, . . . 520*n*). For each domain, a plurality of subdomains are created (521*a*, 521*b*, . . . 521*n*). Each subdomains is configured to execute Reinforcement learning algorithm to obtain a plurality of option macros (522*a*. 522*b*, . . . 522*n*). Option/macros are used in arriving at optimal chip Architecture (OCA).

According to an embodiment herein, the SMDPs are configured to focus on closed loop action over an extended period, which is called as options macros. In SoC design, many decisions are extended over a period of time, in a closed loop format. Hence, the AI framework is designed to use option macros in SoC design activities. The options macros is applied to smaller hierarchical tasks to form HRL. The option macros are applied across SoC AI subdomains to acquire a human level intelligence in designing the SoC. The Options macros include a generalization of primitive actions to include temporally extended actions. For example, the process of fixing a setup time violation involves tasks such as retiming data path, buffering clock path, changing the VT type of the cells in the path, reflow planning and the like. Each of these tasks is included as options macro which is extended in time with closed feedback loop with EDA tools.

According to an embodiment herein, options macros or options are used in arriving at optimal chip Architecture (OCA). Each options includes a policy $\pi$: $S \times A \rightarrow [0, 1]$, Termination condition $\beta$: $S+ \rightarrow [0, 1]$, and Initial state $I \subseteq S$. The option is defined by the triplet parameters $[\pi, \beta, I]$. Some of the options are also derived from a past experiment of the AI setup, by storing the triplet in the database and slightly altering the policy. Policy is a mapping between the option and the following action. By slightly modifying the policy, distribution of action that needs to be taken is obtained. Further, the agent includes a chain of actions. The agent initiates another action, once the selected option is terminated using SMDP transitions. The Options macros is one of a Markov or semi-Markov with a specific timeout mechanism. Thus, the option macros are used for iterative optimization part of OCA, for example floorplan and placement optimization with respect to timing closure issue or verification test case that has long run time and is run by the agent to prove verification coverage of the design.

According to an embodiment herein, the AI framework incorporates SMDPS implemented with max-Q and Hierarchies of Abstract Machines (HAM) framework to achieve faster and most optimal architecture and design closure for SoC. The SMDPs deploy Max-Q framework and HAMs. These are Semi-Markov Options (SMO). SMO indicates that the options represents more detailed states than available to policy that selects the options. Further, HAMs are used to place constraints on the policy learnt by agent SMDPs for policy improvement. Furthermore, the HAMs are used to apply constraints across hierarchy of SMDPs. Each SMDP domain has its own HAM to provide constraints about mapping of higher level SMDP tasks to lower level SMDP tasks in a hierarchy. Also HAM provides ways to relate hierarchy of SMDPs. Since SoC design is always hierarchical, HAMs play large role in determining optimal RL algorithm to be applied across hierarchy of designs (from IP way up to SoC top) and hierarchy of tasks (from extracting optimal chip specification to optimal chip architecture (OCA) to GDSII tape out to layout). According to an embodiment herein, the HAMs are used to derive constraints for SMDPs and relation between low level and higher level tasks.

According to an embodiment herein, HAMs contain four states as used in this invention to call AI subdomain SMDPs. These states are run in all SMDPs or MDPs to determine when to call next SMDPs MDPs and option macros. According to an embodiment herein, the AI framework includes AI SOCD Action states, AI SOCD Call states, AI SOCD Choice states, AI SOCD Stop states. The AI SOCD Action states execute an action in the AI SOCD hierarchical environment. Further, AI SOCD Call states execute another AI SOCD HAM or SMDP as a subroutine. AT SOCD Choice states non-deterministically select a SMDP of AI SOCD. AI SOCD Stop states halt execution of the machine and return control to the previous call state. A top level hierarchy of the AI SOCD HAM or SMDP is the chip top agent and it calls all other agents with domain specific HAMs. Each of the HAM based SMDP is multi objective with vectored rewards, actions and Q values.

According to an embodiment herein, the SoC design framework includes the following modules/domains:

SoC Communication and Network on a Chip (NoC): This module connects blocks to one another thereby establishing connection and integration of SoC and is implemented using a SoC communication AI agent. In this sub domain, main goal of single or multiple agents represented by single or multiple SDMPs (Which can be Max-Q, HAMs or options implementation) is to create optimal communication. This SOC AI subdomain comprises environment which provides rewards and observation to single or multiple type agents. Rewards and observation is related to ease of communication among SoC end points (Masters and slaves, where example master is a processor and slave is a memory port or a configuration interface). Single or multiple agents are configured to receive feedback from environment regarding reduction in latency, Power consumption, increase in throughput of the system, optimal communication topology (NoC topology), decrease in congestion of the physically designed chip as positive reward for a given action like buffering the datapath, retiming the datapath, regrouping the masters and slave into a cluster, creating power islands and rerouting the connectivity wires through dedicated channel to decrease congestion. Furthermore this domain is configured to create and discover polices as combination of these actions and implement them to obtain optimal SoC communication architecture. These AI SOC domain NoC agents are configured to interact with NoC environment to extract MDP, Implement policy gradient, store resulting Q values in the Big database and plan the optimal SoC communication structures SoC Power optimization: The module incorporates techniques used in optimizing various power components of the SoC such as leakage and dynamic power and decreasing effects of ageing in hardware due to electron migration on hardware performance using a SoC Power Agent. SoC Power optimization subdomain involves environment which is configured to provide a feedback to an agent regarding a reduction or increase in power consumption based on agent actions. This AI SOC subdomain contains one or more power agents, which are configured to provide the balance between performance and various power components. Environment is configured to provide a feedback on performance measures like throughput, clock frequency and power consumption measures like leakage power and dynamic power of a particular block or entire SoC. This AI SOCD subdomain is configured to implement further hierarchy of Max-q framework with HAM constraints to optimize SoC power consumption per performance. Actions taken by agents are clock gating, power collapsing a block, partitioning the SoC, power rail redesign etc. These AI SOC domain Power agents are configured to interact with Power environment to extract MDP, Implement policy gradient, store resulting Q values in the Big database and plan the optimal Power structures SoC clocking is a domain for clock design of entire SoC, which involves global and local optimization of clocking using a SoC clock Agent. This also involves estimating and clock tree optimization.

The SoC clocking AI SOC subdomain has environment which is configured to provide a feedback on number of PLLs required, estimated clock power, clock routing congestion and possible issues with clock skew. This AI SOC domain with one or many agents is configured to take actions of inserting PLLs, Clock generation logic (CGL), clock gating and clock programming register implementation. These AI SOC domain clock agents are configured to interact with clock environment to extract MDP, Implement policy gradient, store resulting Q values in the Big database and plan the optimal clocking circuitry SoC Placement and Floor plan: in this domain SoC floor plan is arrived optimally. It includes placement of logic blocks according to reinforcement learnt algorithms and policy. It includes power Island creation, it includes (but is not limited to) coming up with policies to optimize for timing and power through placement.

SoC Placement and Floorplan AI SOC Domain is configured to implement the Placement and Floorplan environment, which as hooks to Floorplan and placement EDA tools. The Environment is configured to use Floorplan and Placement EDA tools as databases and wraps around them to obtain different rewards and observation like congestion, timing, routing channels available, routing utilization and Quality of results (QoR), which may be in tool specific format, but is converted to AI framework generic format so that the AI framework is portable across the EDA vendors. This AI SOC domain is designed to implement one or more subdomains according to HAM and Max-Q implementation as explained. Each subdomain is also configured to implement one or more agents to derive optimal placement and floorplan. The actions taken by agents include, but not limited to moving the sub blocks in the design, adding buffers, reshaping the sub blocks and timing closure of the design, interaction with other AI SoC domain to obtain optimal QoR for placement and SoC floor planning.

SoC Physical design: In the domain SoC Physical design is carried out, including mapping logical design onto physical libraries of cells which contains information like power, physical layout of transistors, physical delay format and physical power routing using a SoC Physical Agent. SoC Physical design AI SoC domain is configured to implement environment to provide observation and reward for physical design quality such as routing congestion, timing, power analysis, power routing. This AI SOC domain is configured to implement multiple sub domains related to physical design for mapping logical design to technology library. It is also configured to implement one or more agents to take actions such as buffering, altering power routing, inserting power switches, inserting clock gates, retiming the data path, removing or adding additional PLLs. Agents are also configured to interact with other AI SoC domains and sub domains to obtain optimal SoC Physical design. Further this AI SoC domain and its sub domains are configured to implement the hooks to various EDA tools to obtain generic format of the observation from a tool specific format.

SoC logic verification: The module involves verifying chip logic using verification agent. The verification process involves various verifications and collecting metrics and reporting bugs to improve quality of SoC and provide confidence in functionality of SoC. SoC logic verification AI SoC domain is configured to implement the environment, to provide observation about bugs found in the design, verification coverage, test case failure, assertion failures, inferring debug log. This AI SOC domain is also configured to implement one or more sub domains according to Max-Q, HAM and options frame work to obtain the verification closure of the SoC. Each AI SoC subdomain of this AI SoC domain is configured to implement one or more agents to take actions such as generating test cases using libraries of test function, running test cases with functional simulator EDA tool, debug actions such as reading verification log files, Coverage log files, fixing the design bug and accessing databases to store Q-values at the end of each testing. There are multiple Q values that reflect the amount of verification done, number of bugs getting closed after an action such as test case generation. Also design bug fixing is done by a separate bigger SMDP in implementing Max-Q, options or HAM or combination hybrid. Also the agents related to this AI SOC domain and its sub domain are configured to interact with other AI SOC domains like top level SoC MDP via database to obtain verified optimal SoC circuit and close the verification highest coverage possible. This AI SoC domain is configured to implement hooks to various EDA Functional simulator and debug tools to obtain the information observation like code coverage, assertion coverage and start and end of a test case.

SoC physical Verification: The module verifies the physical implementation of the SoC using verification agent. The verification process involves verification of LVS Vs DRC, post layout timing, routing, IR drop, Power feature correctness, Electric rule check. Further, various policies are explored in this domain to provide optimal tradeoff for physical design (of the SoC circuit) considering all these factors.

SoC Physical Verification AI SoC domain is configured to implement environment to provide observation about the LVS, DRC errors, logs, post layout timing, IR Drop and QoR of physical design. These observations are obtained by environment from the EDA tools which is further processed to generate generic format from tool specific format and fed as reward or observation to agent. This AI SoC domain is configured to implement the multiple AI SOC subdomain, options macros via hybrid MAX-Q and HAM framework. Actions taken by agents of each of these subdomains include, but not limited to remapping libraries, reporting the error ERC errors and obtaining standard fix from database, updating Q values to the database.

SoC timing: The domain involves pre-layout and post-layout timing closure. Timing closure involves taking particular actions and policies like solving setup time and hold time, assigning false paths, etc. SoC Timing AI SoC domain has a main objective to close timing of the SoC. Timing violation includes setup and hold violation, false paths, multicycle paths and general exceptions. The environment of Timing closure AI domain, which is hooked to timing closure tool to provide rewards and observation about setup time violation, hold time violation, total negative slack, and in worst case negative slack and cross talk violations. The AI SoC Timing agents are configured to contain one or more levels of Max-Q recursive structure implemented with hybrid HAM constraints described previously. This AI SoC domain and its sub domain are configured to implement Agents, whose main actions are to fix the setup and hold violation by retiming, redesigning data paths and balancing Clock trees. Each of these actions are implemented as options as well.

SoC DRC (Design Rule check), SoC ERC (Electric Rule check): In this domain, ERC and DRC closure policies are learnt, applied and planned using deep reinforcement learning techniques. SoC DRC/ERC AI subdomains are configured to implement efficient fixing of the ERC violations like Floating and nets and unconnected VDD/VCC pins, Shorts of Power nets, power domain crossing without a proper level shifter and isolation cells. DRC violations includes, spacing rules between metals, minimum width rules, via rules, another set of rules are LVS rules, which ensures Layout that is generated is equivalent to netlist that is generated before physical design. It checks for shorts, opens and circuit parameter mismatch. This AI SoC domain is configured to implement the hierarchical Max-Q framework with HAM constraints as suggested above. This AI SoC domain is also configured to implement the one or more agents which are configured to take actions to fix floating grounds by connecting them, corrects shorted VDD to remove shorts by separating shorts. They are configured to take action to fix the LVS violations by fixing floating nets, correcting parameters of the layout, so become equivalent to netlist. Agents are also configured to take actions to fix DRC, such that the spacing between metals are provided according to design rules and width of the routes are set according to definition of the process rules.

SoC Package: In this domain, packaging related policies and actions are learnt. Policies related to substrate design, pin-muxing, padding, power ball assignments, possible PCB load on I/O pins and the like. Policies for selecting type of packages are also learnt at the end of all tasks in this domain. SoC Package AI SOC domain involves in providing optimal package, I/O, substrate design. This AI SoC domain is configured to implement environment which is hooked to I/O models, I/O cell libraries, Substrate models, PCB models, pad-ring configuration and pin-muxing. The environment is configured to provide the feedback, observations and rewards about I/O constraints being met, substrate constraint being met or not met, I/O models being functionally competent or qualified to meet the I/O load and drive requirement, capability of I/O cell in meeting the DRC, current and transient characteristic required to drive the load on the board as well sink in current from board components. It also gives observation about scenarios involved in the I/O usage like concurrency on pin-muxing to provide optimal utilization of I/Os.

According to an embodiment herein, the aforementioned domains are implemented using the AI framework. Each domain is configured to incorporate an AI logic design environment, AI logic design agent, AI logic design task, AI logic design experiment. The SoC design framework envisaged by the embodiments herein aims to extract the learning from the experimentation of all the aforementioned modules, and stores the learning results in a database, preferably in the form of Q-values or neural network weights or a lookup table, or in any other appropriate format. For example, Q-values are derived from the Bellman's equation for policy iteration. Alternatively, Q-values are also derived from the options or macros or HAM or Max-q methods and stored in the database for deriving the MDP.

Typically, Q-Values are construed as action value functions, which provide the value of particular state for an action given a policy $\pi$. Q-values are defined by the function $$q\pi(s,a)=E\pi[Gt|St=s,At=a]$$

Where $q\pi$ are Q values, Gt is total reward for the policy from state 's' and action 'a', St and At are state and action space. The Q-values are generated in the learning process and stored on the database as program variables. Apart from the value function defining the total value from state 's', the policy $\pi$ is defined as $$V\pi(s)=E\pi[Gt|St=s]$$

Values with or without value function approximation are stored in the local program variable or separate database at the end of learning process.

According to an embodiment herein, Reinforcement Learning (RL) algorithm terminates for each SoC domain at the convergence of Q-values below a preset threshold value. Alternatively, the Reinforcement Learning (RL) algorithm is terminated on completion of predefined number of experiments/episodes. Further, the Reinforcement Learning (RL) algorithm is terminated once it reaches a predefined target performance or exit state. Examples of predefined state include predefined throughput target of NoC (Network on a Chip) in inter-chip Communication domain setup or predefined power numbers of the dynamic power of the chip, or predefined clock skew, or predefined number of clocks. Yet the Reinforcement Learning (RL) algorithm is terminated when a predefined hierarchically optimal goal or state is reached.

Figure 7:
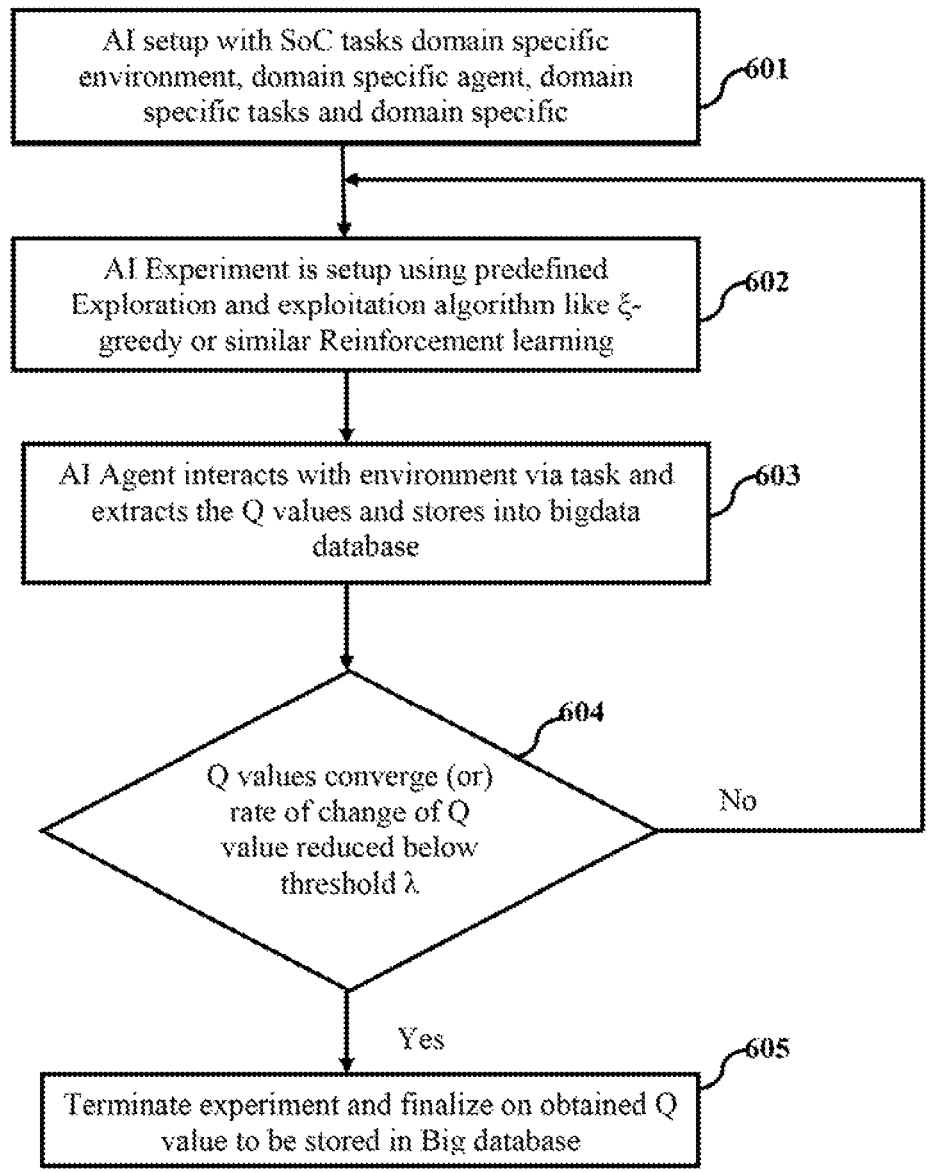
FIG. 7 illustrates a flowchart explaining a method of terminating Reinforcement Learning (RL) process on convergence of Q value for each SoC design domain in SoC design framework, according to an embodiment herein.

FIG. 7 illustrates a flowchart illustrating the steps involved in termination of Reinforcement Learning (RL) algorithm on convergence of Q value. According to an embodiment herein, reinforcement learning is initiated by an AI setup with a plurality of domains corresponding to the SoC design (601). Further, domain AI setup is done with domain specific AI agents, domain specific environment, and domain specific tasks. The domain AI are setup in form of MDPs, SMDPs, HAMs and MAX-Q for the initialized, compiled and non-optimized chip database to further optimize and generate desired SoC configuration. Further, AI experiment setup is done for each SoC domain. The AI experiment setup includes configuring each SoC domain to implement (execute) an algorithm, such as, greedy algorithm or a tuned greedy algorithm, to perform the exploitation and exploration (602). Subsequently, the domain specific AI agent is configured to interact with the domain specific environment via AI task to extract Q values pertaining to a specific domain. Further, the extracted Q values are stored in a database/big data (603). The process is continued for each domain until the Q values is converged, or rates of change of Q value is below a preset threshold λ (604). The learning is estimated based on the number of inferences drawn from the Q values of each SoC domain. Accordingly new policies which are a resultant of learning are devised/derived and stored in domain specific databases. New policies learnt in a particular domain are optimized and combined/iterated with policies learnt in other relevant domains, and hierarchically relevant, optimal policies for planning SoC are generated (605).

Figure 8:
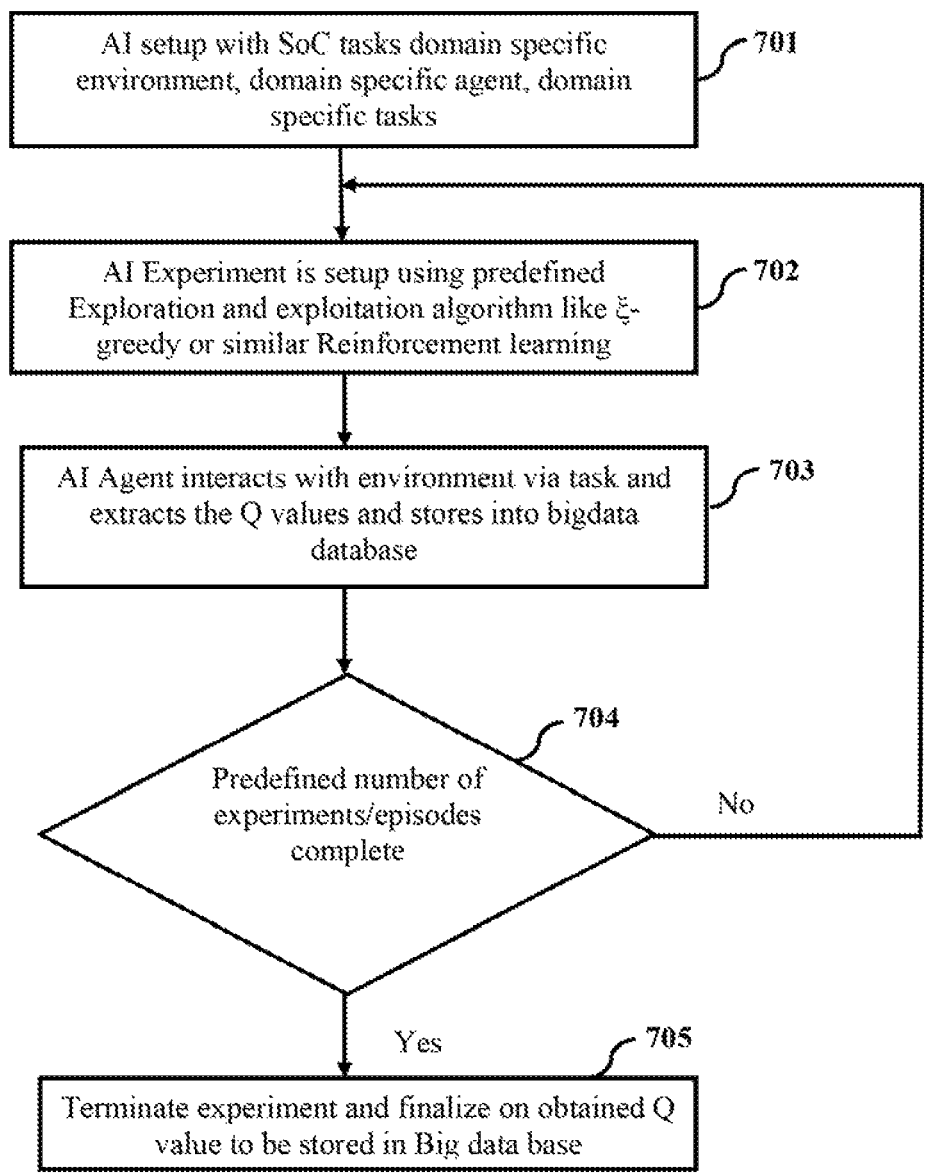
FIG. 8 illustrates a flowchart explaining a method of terminating Reinforcement Learning (RL) process on completing predefined number of experiments for each SoC design domain individually in SoC design framework, according to an embodiment herein.

FIG. 8 illustrates a flowchart explaining a method of terminating Reinforcement Learning (RL) process on completing predefined number of experiments or episodes for each SoC design domain individually in SoC design framework, according to an embodiment herein. According to an embodiment herein, reinforcement learning is initiated by an AI setup with a plurality of domains corresponding to the SoC design (701). Further, domain AI setup is done with domain specific AI agents, domain specific environment, and domain specific tasks. The domain AI are setup in form of MDPs, SMDPs, HAMs and MAX-Q for the initialized, compiled and non-optimized chip database to further optimize and generate desired SoC configuration. Further, AI experiment setup is done for each of the SoC domains. The AI experiment setup includes configuring each SoC domain to implement (execute) an algorithm, such as, greedy algorithm or a tuned greedy algorithm, to perform the exploitation and exploration (702). Subsequently, the domain specific AI agent interacts with the domain specific environment via AI task to extract Q values pertaining to a specific domain. Further, the extracted Q values are stored in a database/big data (703). The Reinforcement Learning (RL) algorithm is terminated on completion of predefined number of experiments/episodes (704). The learning is estimated based on the number of inferences drawn from the Q values of each SoC domain. Corresponding new policies which are a resultant of learning are devised/derived and stored in domain specific databases. New policies learnt in a particular domain are optimized and combined/iterated with policies learnt in other relevant domains, and hierarchically relevant, optimal policies for planning SoC are generated (705).

Figure 9:
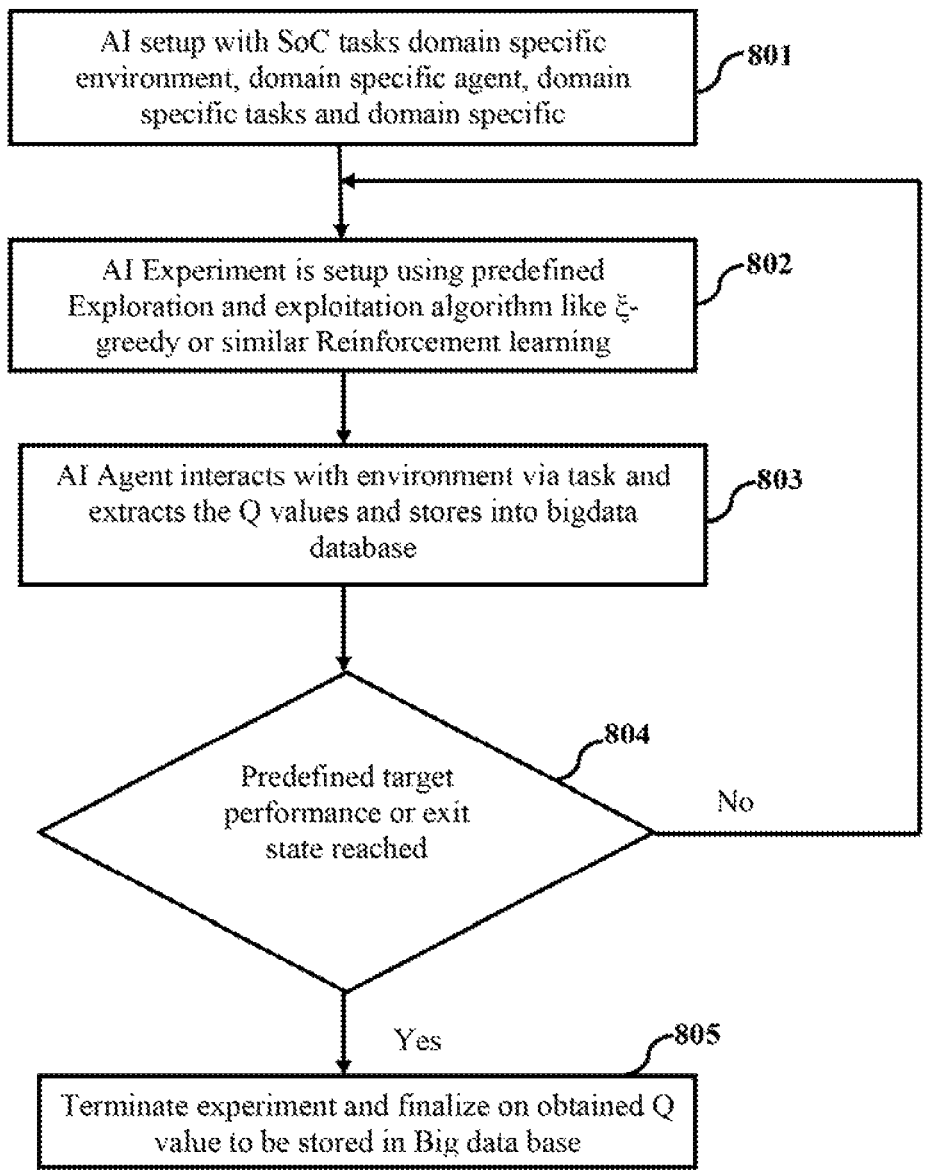
FIG. 9 illustrates a flowchart explaining a method of terminating Reinforcement Learning (RL) process on reaching or achieving predefined target performance or target state for each SoC design domain individually in SoC design framework, according to an embodiment herein.

FIG. 9 illustrates a flowchart explaining a method of terminating Reinforcement Learning (RL) process on reaching or achieving predefined target performance or target state for each SoC design domain individually in SoC design framework, according to an embodiment herein. According to an embodiment herein, reinforcement learning is initiated by an AI setup with a plurality of domains corresponding to the SoC design (801). Further, domain AI setup is done with domain specific AI agents, domain specific environment, and domain specific tasks. The domain AI are setup in form of MDPs, SMDPs, HAMs and MAX-Q for the initialized, compiled and non-optimized chip database to further optimize and generate desired SoC configuration. Further, AI experiment setup is done for each of the SoC domains. The AI experiment setup includes configuring each of the SoC domain to implement (execute) an algorithm, such as, greedy algorithm or a tuned greedy algorithm, to perform the exploitation and exploration (802). Subsequently, the domain specific AI agent interacts with the domain specific environment via AI task to extract Q values related to a specific domain. Further, the extracted Q values are stored in a database/big data (803). The Reinforcement Learning (RL) algorithm is terminated on reaching predefined target performance or exit state (804). The learning is estimated based on the number of inferences drawn from the Q values of each SoC domain. Corresponding new policies which are a resultant of learning are devised/derived and stored in domain specific databases. New policies learnt in a particular domain are optimized and combined/iterated with policies learnt in other relevant domains, and hierarchically relevant, optimal policies for planning SoC are generated (805).

Figure 10:
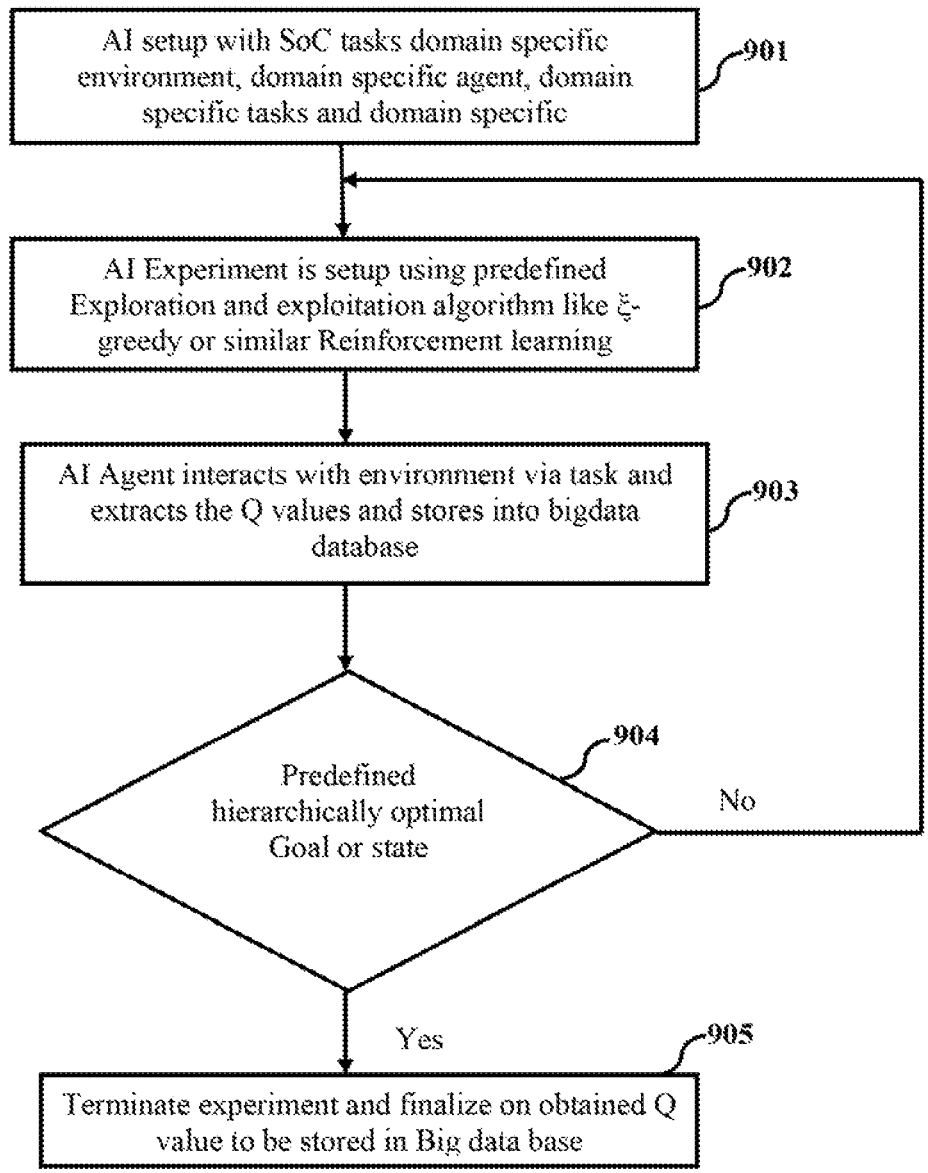
FIG. 10 illustrates a flowchart explaining a method of terminating Reinforcement Learning (RL) process on reaching or achieving predefined hierarchically optimal state or goal derived for each SoC design domain individually in SoC design framework by a top down approach, according to an embodiment herein.

FIG. 10 illustrates a flowchart explaining a method of terminating Reinforcement Learning (RL) process on reaching or achieving predefined hierarchically optimal state or goal derived for each SoC design domain individually in SoC design framework by a top down approach, according to an embodiment herein. According to an embodiment herein, reinforcement learning is initiated by an AI setup with a plurality of domains corresponding to the SoC design (901). Further, domain AI setup is done with domain specific AI agents, domain specific environment, and domain specific tasks. The domain AI are setup in form of MDPs, SMDPs, HAMs and MAX-Q for the initialized, compiled and non-optimized chip database to further optimize and generate desired SoC configuration. Further, AI experiment setup is done for each SoC domain. The AI experiment setup includes configuring each SoC domain to implement (execute) an algorithm, such as, greedy algorithm or a tuned greedy algorithm, to perform the exploitation and exploration (902). Subsequently, the domain specific AI agent interacts with the domain specific environment via a task to extract Q values pertaining to a specific domain. Further, the extracted Q values are stored in a database/big data (903). The Reinforcement Learning (RL) algorithm is terminated on reaching preset hierarchically optimal state (904). The learning is estimated based on the number of inferences drawn from the Q values of each SoC domains. Corresponding new policies which are a resultant of learning are devised and stored in domain specific databases. New policies learnt in a particular domain are optimized and combined/iterated with policies learnt in other relevant domains, and hierarchically relevant, optimal policies for planning SoC are generated (905).

Figure 11A:
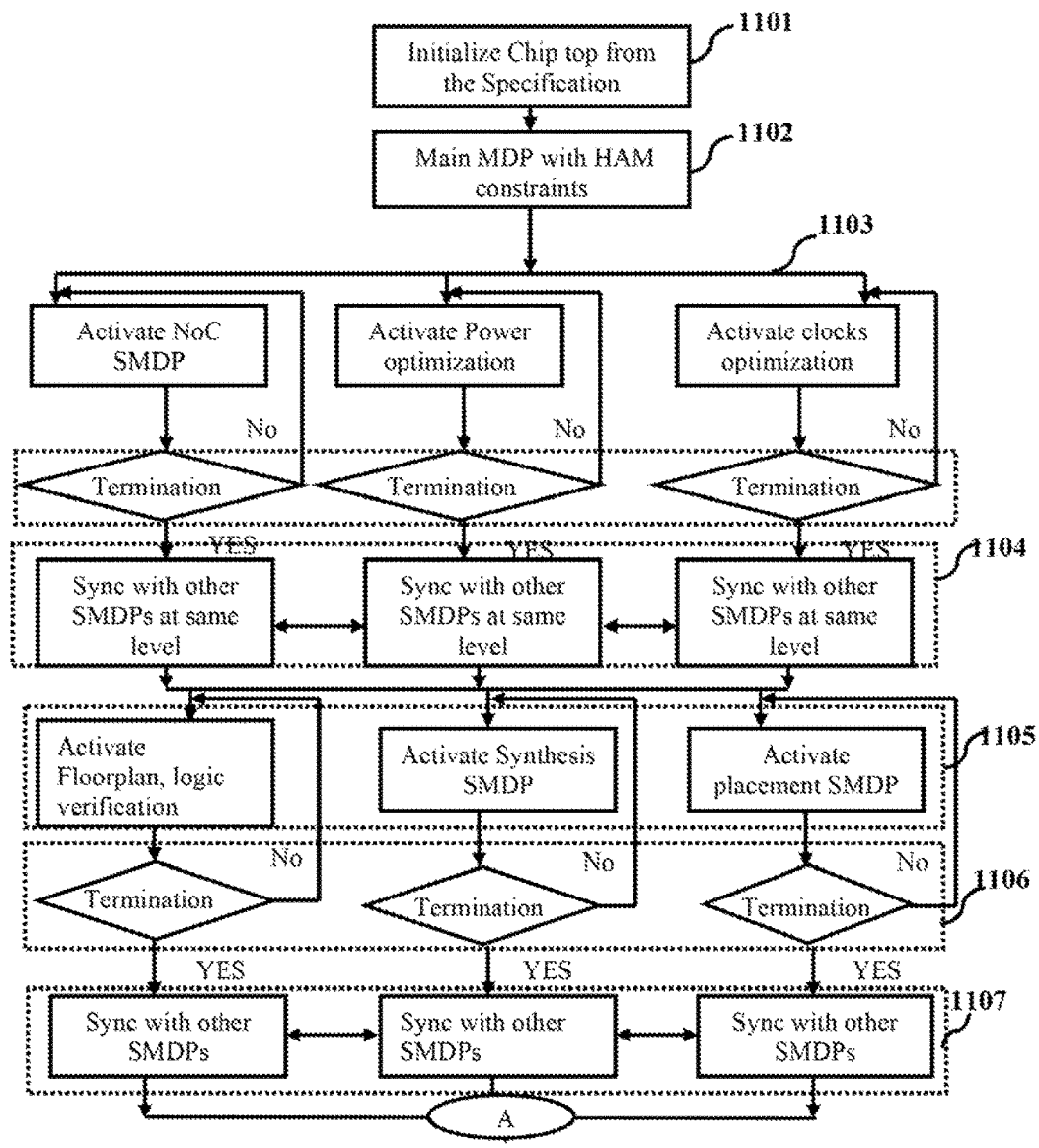
FIGS. 11A and 11B jointly illustrates a flowchart explaining a method of synchronizing a hierarchy of SMDPs in SoC design process, according to an embodiment herein.
Figure 11B:
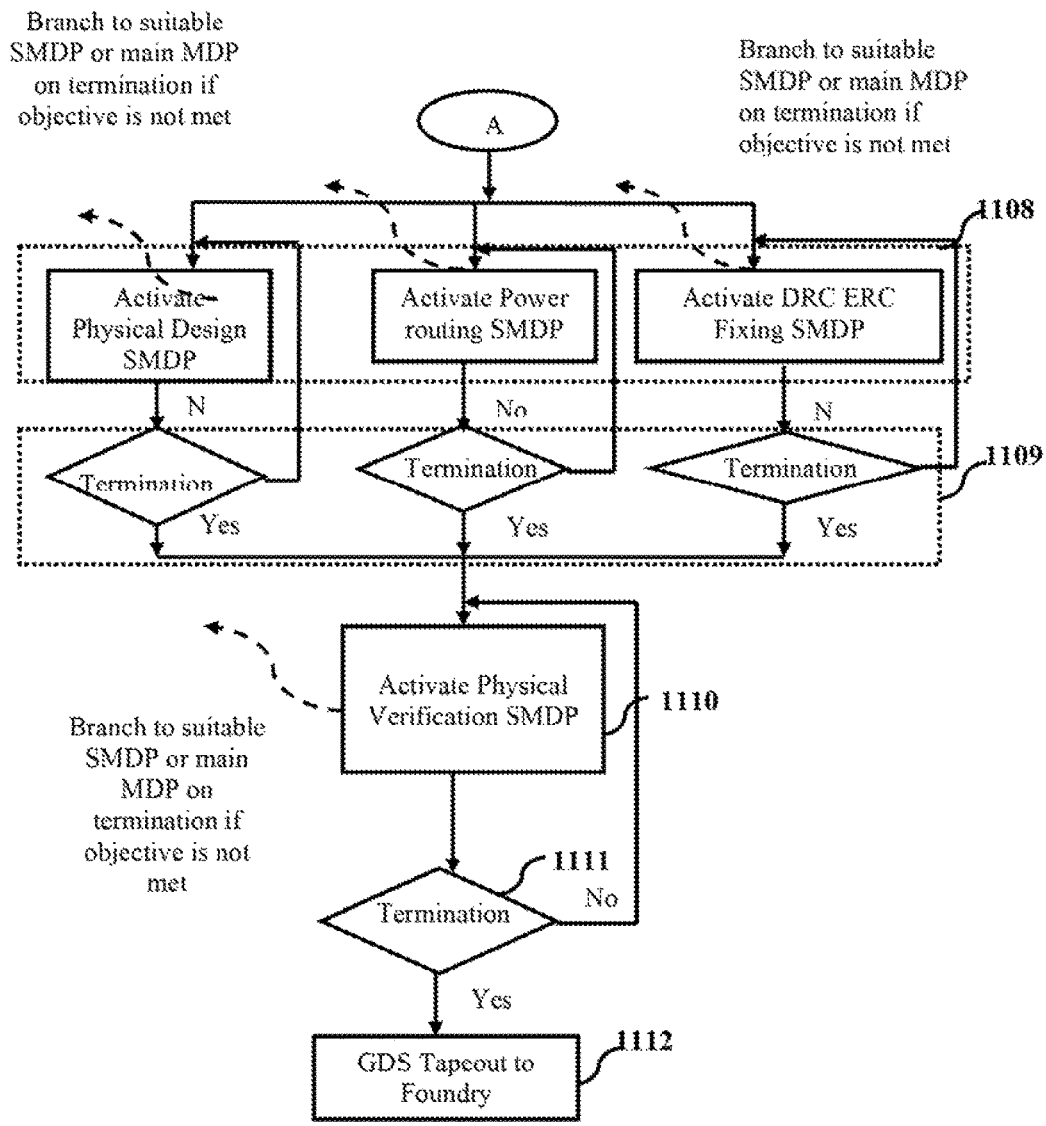

FIGS. 11A and 11B jointly illustrates a flowchart explaining a method of synchronizing a hierarchy of SMDPs in SoC design process, according to an embodiment herein. The method includes initializing a chip topology from a specification or a database (1101). Further, the chip topology is associated to a Markov Decision Process (MDP) with HAM constraints (1102). Subsequently, the chip topology is associated to a plurality of SMDPs or MDPs. The plurality of SMDPs or MDPs are activated (1103). Thereafter, the plurality of SMDPs or MDPs are synchronized when the plurality of activated SMDPs or MDPs is terminated on achieving a preset Q-values or a preset objective (1104). A plurality of subdomains at a same level is activated (1105). The plurality of activated subdomains is terminated on achieving a preset Q-values or a preset objective (1106). Further, the plurality of subdomains is synchronized, when the plurality of activated subdomains is terminated on achieving a preset Q-values or a preset objective (1107). The subdomains which are dependent on synchronized subdomains are activated (1108). The dependent subdomains are terminated after achieving a preset objective (1109). Subsequently, a physical verification of the plurality of SMDPs is initiated (1110). Physical verification process is terminated after achieving a preset goal number of experiments (1111). Thereby, an optimal chip architecture for designing SoC is obtained. The chip design are stored in GDS (Graphic Database system) and forwarded to foundry for chip manufacturing 1112.

According to an embodiment herein, synchronization is done by making just one SMDPs to communicate with other SMDP, that it has reached terminal state, when one SMDP does not depend on another SMDP (for example, active power and placement SMDPs). The synchronization is one of a global broadcast signal, suggesting that SMDP has reached terminal state. The terminated SMDP also is configured to upload its end results such as metrics of time closure by timing SMDP or when bugs are found in verification SMDPs into global database. Alternatively, each SMDP is operated in a lock step or iterative loop, when one SMDP depends on another SMDP. Each SMDP communicates with other SMDPs in a separate synchronization state, (for example, logic Verification SMDP and logic design SMDP). Each SMDP communicate their end results and wait for bug fixation, optimization and call that design is in decent shape to send it to PD or synthesis.

According to an embodiment herein, two or more SMDPs are involved in a synchronization process and the end results are shared among a plurality of SMDPs, options macro and MDPs.

Figure 12:
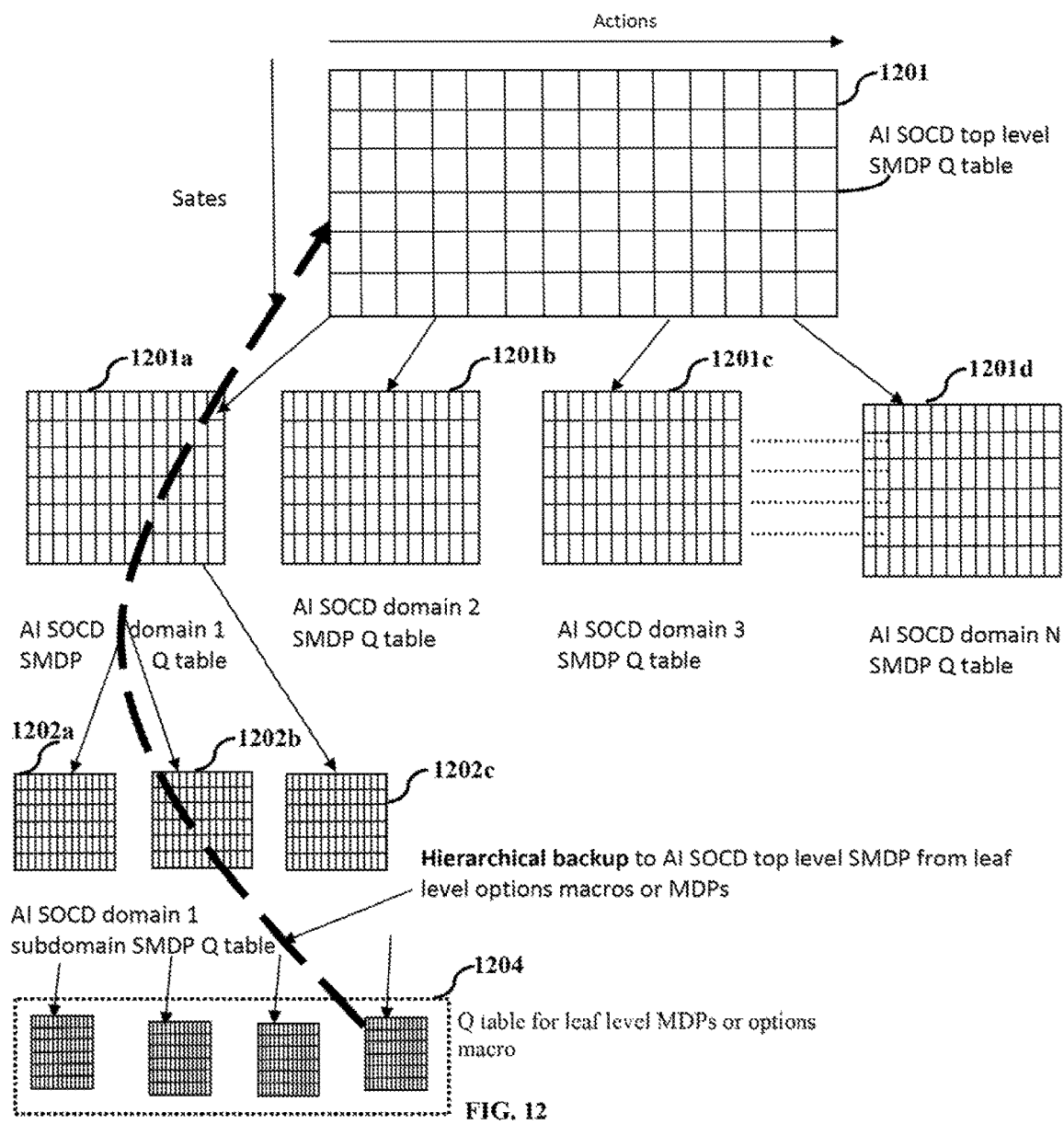
FIG. 12 illustrates a top view or a schematic view of a hierarchical Q-tables stored in a SQL schema or document database in SoC design process, according to an embodiment herein.

FIG. 12 illustrates a top view or a schematic view of a hierarchical Q-tables stored in a SQL schema or document database in SoC design process, according to an embodiment herein. The AI framework is configured to perform a hierarchical backup to AI SOCD top level SMDP from leaf level options macros or MDPs. The HAM frame work of states is used to synchronize SMDPs, when one SMDP calls other SMDP during a calls state of HAM constraints.

According to an embodiment herein, the entire SoC design is modified based on a Max-Q Framework. The SoCD 1201 is the top level SoC design task, which is decomposed into SocD0, SoCD1, SoCD2, ... SoCDN. Each of these SocD are mapped to a plurality of AI SoC domain 1201a, 1201b, 1201c, 1201d. In an example, a root task SoCD implements a policy $\pi$, and the hierarchy of tasks {SocD0, SoCD1, SoCD2, ... SoCDN} is used to implement the policies {$\pi 0$, $\pi 1$, $\pi 2$, ... $\pi N$}, which collectively represents the policy $\pi$. Further, each domain is divided into further sub domains 1202a, 1202b, 1202c to implement a hierarchy of policy and SMDPs like recursive Max-Q, HAMs or end point options/macros 1204.

According to an embodiment herein, the SMDP Q-learning is applied across AI framework using SoCD subdomains. Q values are given by $$Q^\pi(i, s, a) = V^\pi(a, s) + \sum_{s',\tau} P_i^\pi(s', \tau | s, a)\gamma^\tau Q^\pi(i, s', \pi(s'))$$

Where $Q\pi(i,s,a)$ is Q value following policy $\pi i$ of the ith SMDP, $V\pi$ is the value function at the state S, with action a, following policy $\pi$, and $Pi\pi$ is the transition probability to next state following policy $\pi$ According to an embodiment herein, storage of Q-value and usage are very much different because of recursive structure of Max-Q framework. Different Q-Values are generated at each level of SMDP. So equation for Q value is given by:

$$Q^\pi(i1, i2, i3, \ldots, in, s, a) = $$
$$V^\pi(a, s) + \sum_{s',t} P_{i1,i2,i3\ldots in}^\pi(s', \tau | s, a)\gamma^\tau Q^\pi(i1, i2, i3, i4, \ldots in, s', \pi(s'))$$

where i1, i2, i3 ... in are introduced by iterative SMDPs involved, and n denotes nth level of Q value. As millions of levels of SMDPs are involved and there are billions of Q values, the Q values are stored in the database. The database has a capacity of 100s peta bytes to enable in combining and obtaining final Q value of a current SoC design.

Final Q value of top level SMDP will be of the form:

$$Q^\pi(s,a) = V^\pi(a,s) + \Sigma_{s',t} P^\pi(s',\tau|s,a)\gamma^\tau Q^\pi(s',\pi(s'))$$

The Q value is a function of Q values of all the hierarchical SMDP Q values at a given state of top level SMDP. The Q value functions require scaling each reward before performing the summation. The scaling factor of all other Q value is determined by Deep neural net (DNN).

With respect to FIG. 12, the Q values of Hierarchical SMDP structure is stored in a Table based Databases (such as MYSQL and MSSQL) or a document based databases (such as NOSQL, Mongodb) or graph databases. Each database include a foreign key or a pointer which points to child SMDP Q-Values. Further, the top level SMDPs Q values depend on a maximum of Q values of the lower level SMDPs from the state of entry. The process of mapping top level SMDP Q values to lower level Q values continues down the hierarchy until the lowest level MDP or options macro is reached. The top level SMDP Q values is given by the following equation:

$$Q\pi(s,a)(\text{top SMDP}) = \tau gi(\varphi)*f(\max\{Qi\pi(s,a)\})$$

where $gi(\varphi)$ and $f()$ are obtained using training on a Deep neural network and $Qi\pi(s,a)$) is ith level Q value of a child SMDP.

According to an embodiment herein, the deep neural network is a Hierarchical Deep SMDP Network (HDSN) or Deep Max-Q network or Deep HAM networks. In HDSN (unlike DQN), the experience replay is hierarchical, where one or more Deep neural networks are used to obtain the relation between SMDPs and further to obtain relation function approximation between different Q values. In HDSN, then experience replay is used to obtain relation between different SMDPs Q value.

Figure 13:
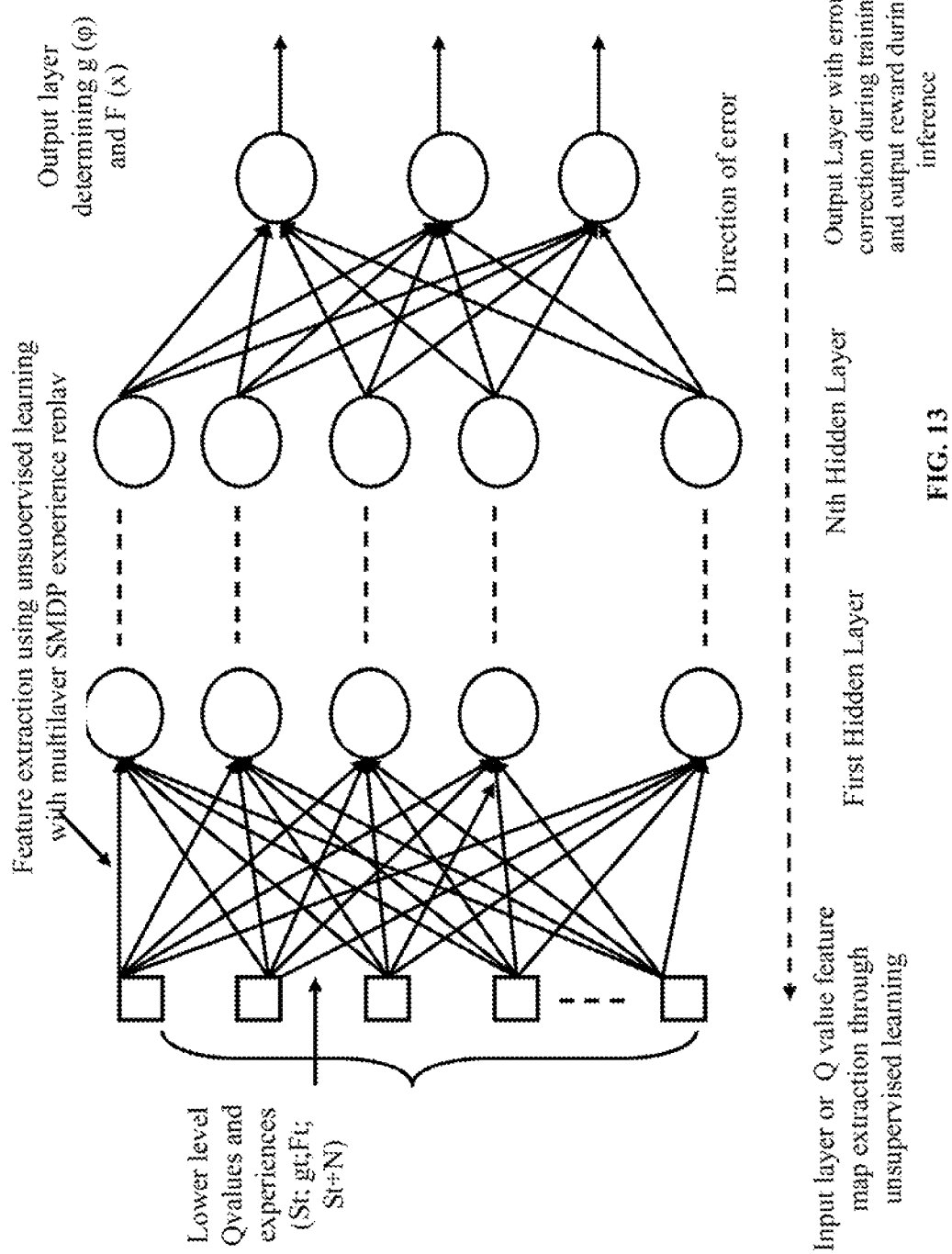
FIG. 13 illustrates a block diagram or a schematic representation of Deep Neural network used for experience replay in a HDSN in SoC design process, according to an embodiment herein.

FIG. 13 illustrates a block diagram or a schematic representation of Deep Neural network used for experience replay in a HDSN in SoC design process, according to an embodiment herein. The HDSN is used to obtain a relation between different SMDPS in the hierarchical AI. Further, the HDSN is configured to obtain relation function approximation between different Q values.

According to an embodiment herein, the SMDP Q values obtained from the lower level SMDP tables are passed through DNN to obtain higher level Q values. Thus, DNN is used for transforming the Lower level Q values to higher level SMDP Q values. Further, the hierarchy of Q value are networked through DNN. Different network configurations are used at different level of SMDP. OCA (Optimal Chip architecture) is defined as the collection of Q tables, SMDPs, Relation between them across all hierarchy. Optimal Chip Architecture (OCA) corresponds to a maximum Q value of the top level SMDP.

According to an embodiment herein, the maximum Q value of top level SMDP is obtained across the AI SOC domain. The AI SoC domain is further decomposed into a recursive Max-Q framework or called through HAM choice states or a combination of Max-Q and HAM. For example, front end integration of the SoC is purely a decomposition of MAX-Q value function, while bottom up synthesis is a HAM, which calls for a synthesis of different states or sub block synthesis after the completion of synthesis of one module level. Max-Q is also used in functional verification, in which whole chip verification value function is split into hierarchical tasks of block level verification, top level verification. The verification process is performed to ensure that a block level verification is completed. Thus, the AI SOC design is split into a number of SMDPs to achieve the maximum Q value for top level SMDP, and OCA is obtained from the maximum Q value at the top level SMDP.

Figure 14:
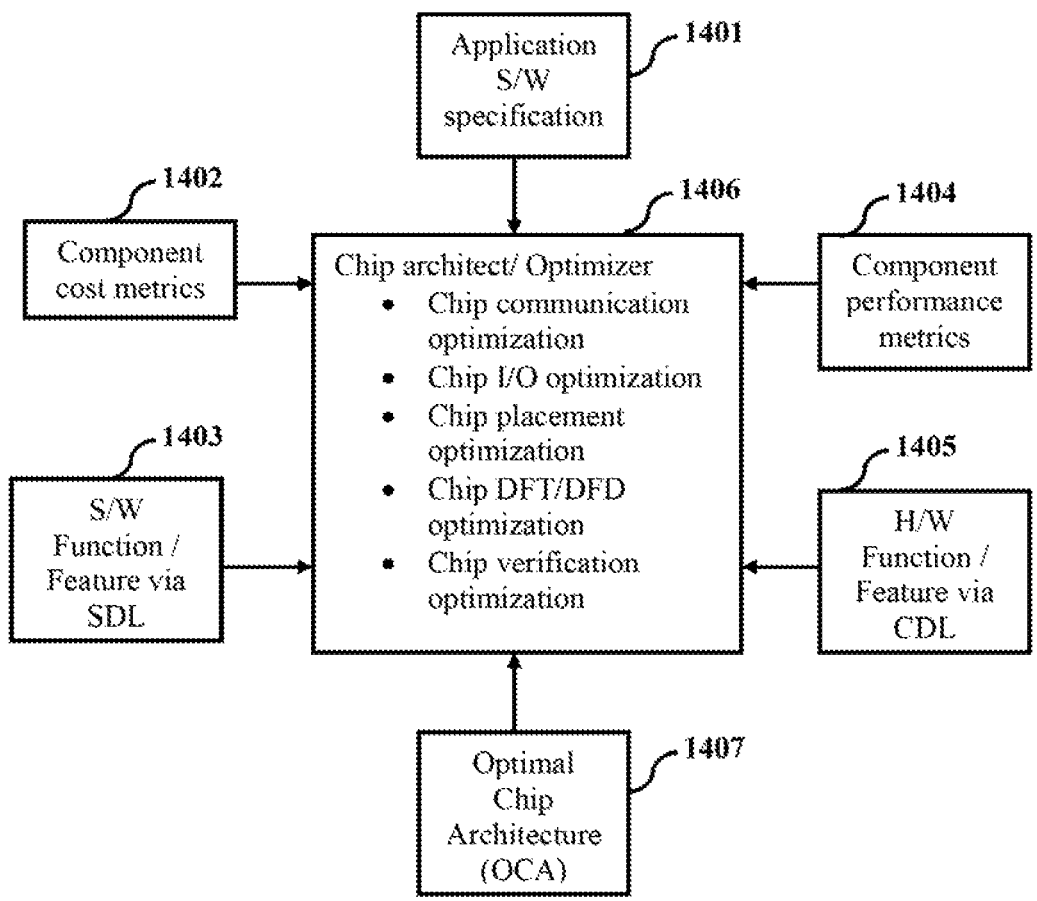
FIG. 14 illustrates a functional block diagram of a system for generating an optimal Chip Architecture (OCA) using AI flow of hierarchical Reinforcement learning in SoC design process, according to an embodiment herein.

FIG. 14 illustrates a functional block diagram of a system for generating an optimal Chip Architecture (OCA) using AI flow of hierarchical Reinforcement learning in SoC design process, according to an embodiment herein. According to an embodiment herein, a chip architect optimizer based on AI hierarchical Reinforcement learning is configured to receive input from application software specification 1401, component cost metrics 1402, component performance metrics 1404, software function via a System Description Language (SDL) 1403, and hardware function via a Chip Description Language (CDL) 1405. The chip architect optimizer 1406 is further configured to perform Chip communication optimization, Chip I/O optimization, Chip placement optimization, Chip DFT/DFD optimization, and Chip verification optimization. Finally, an optimal chip architecture 1407 is generated.

Figure 15:
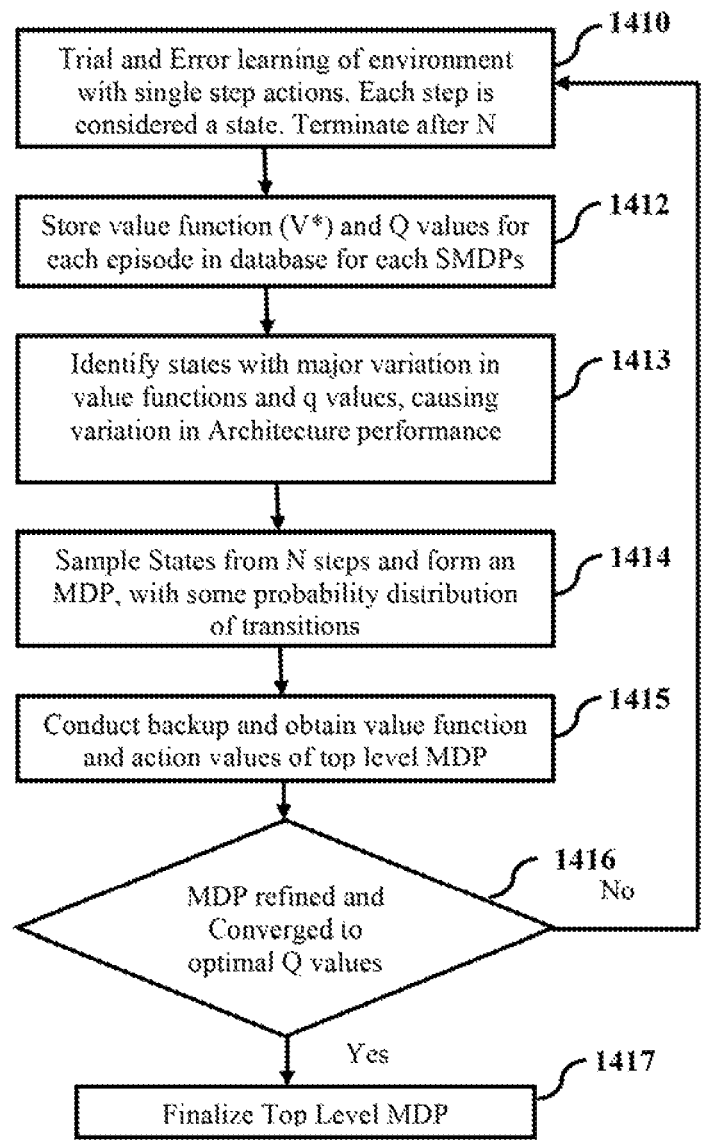
FIG. 15 illustrates a flow chart explaining a method of extracting MDP for each domain in SoC design process using a reinforcement learning process, according to an embodiment herein.

FIG. 15 illustrates a flow chart explaining a method of extracting MDP for each domain in SoC design process using a reinforcement learning process, according to an embodiment herein. According to an embodiment herein, a trial and error learning of environment is executed with a plurality of single step actions. Each step action is associated to a state (1410). The execution of steps is terminated after N iteration. The value function (V*) and Q values for each episode/step are stored in a database (for example, alpha DB) for each SMDPs (1412). States are identified as a major variation in value functions and q values, like Architecture performance or results when interacting with EDA tools (1413). Sample States from N steps are obtained to form MDP, with some probability distribution of transitions (1414). MDP refined and Convergence seen to optimal Q values. Thereafter, a backup is conducted to obtain value function and action values of top level MDP (1415). The MDP is refined and converged to obtain optimal Q values (1416). Thus, a top level MDP is finalized (1417).

Figure 16:
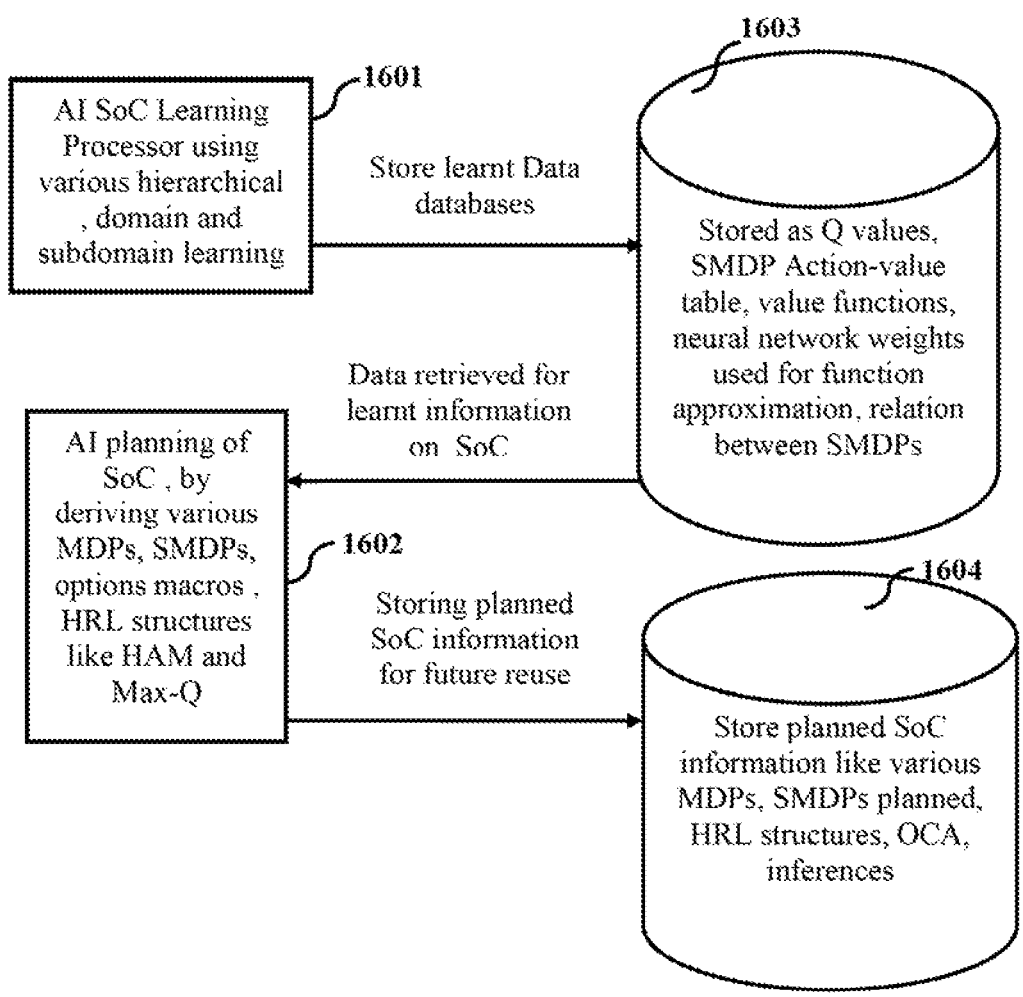
FIG. 16 illustrates a functional block diagram of a Big data framework in SoC design process, according to an embodiment herein.

FIG. 16 illustrates a functional block diagram of a Big data framework in SoC design process, according to an embodiment herein. Reinforcement learning is carried out hierarchically using Hierarchical reinforcement learning or Deep Hierarchical reinforcement learning or any methods of reinforcement learning that involves learning from environment and planning the Chip architecture from learnt data (1601). The learnt data is stored in database. The stored data include Q values. SMDP Action-value table, value functions, neural network weights used for function approximation, and relation between SMDPs (1602). The stored data is retrieved for learnt information on SoC. Using the stored data, AI planning of the SoC is performed by deriving various MDPs, SMDPs, options macros, HRL structures like HAM and Max-Q (1603). The planned SoC information is stored for future reuse. The planned stored include SoC information like plurality of MDPs, SMDPs planned, HRL structures, OCA, and inferences (1604).

Figure 17:
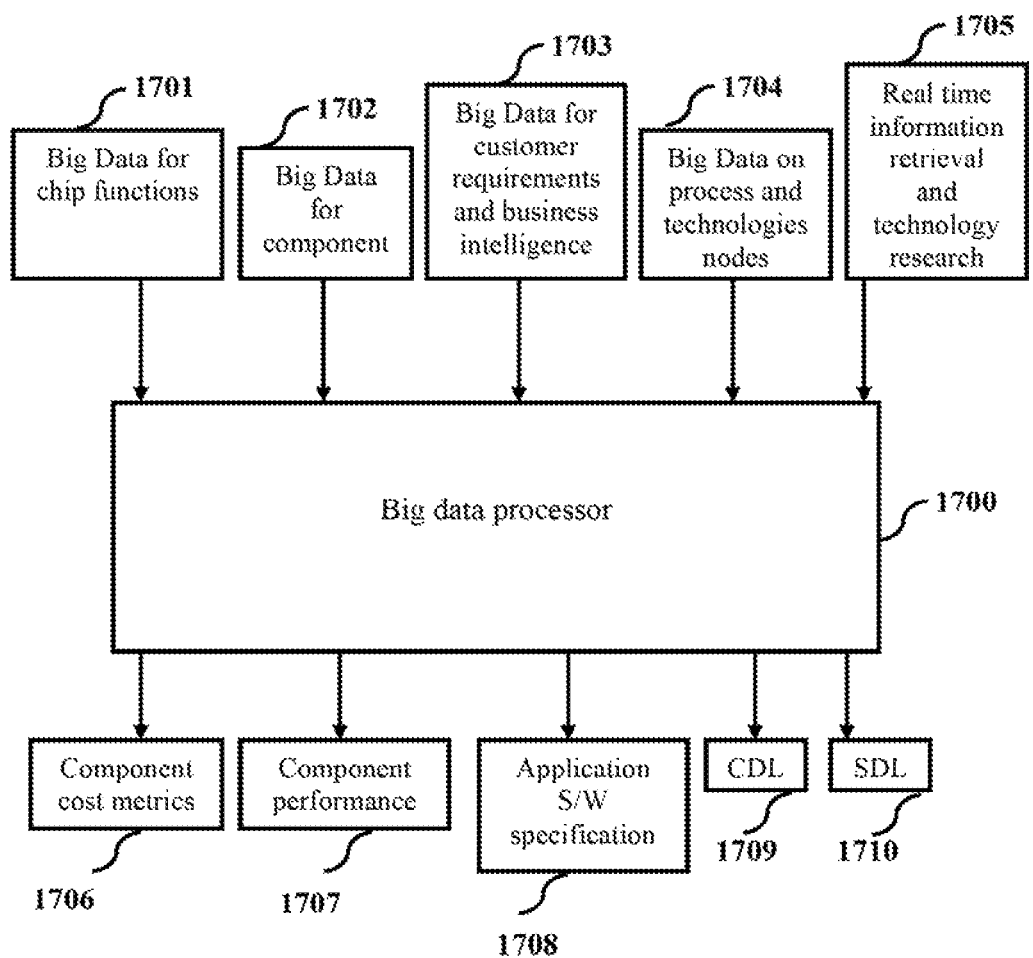
FIG. 17 illustrates a flowchart explaining a method of abstracting SoC domains and subdomains in SoC design process, according to an embodiment herein.

FIG. 17 illustrates a flowchart explaining a method of abstracting SoC domains and subdomains in SoC design process, according to an embodiment herein. A new specification for electronics systems design is obtained from using learnt information and inferences stored in Big data processor (1700). Big data processor (1700) receives and uses the board level PCB information from old and existing PCB design. It uses machine readable format of existing component specification and Learnt information from SoC design from database. The big data processor (1700) is configured to receive and utilize big data for chip function (1701), big data for component performance (1702), Big Data for customer requirements and business intelligence (1703), Big Data on process and technologies nodes (1704), Real time information retrieval and technology research (1705).

By combining learnt information, the big data processor 1700 is configured to provide insight regarding new electronics systems. Other information that is used by Big data processor are cost of components, quality and availability. Output of big data processor contains the estimation of cost of new electronics components 1706, component performance 1707, application software specification 1708, CDL 1709, and SDL 1710, applications and target customers who may be interested in SoC targeted to new electronics system.

Figure 18:
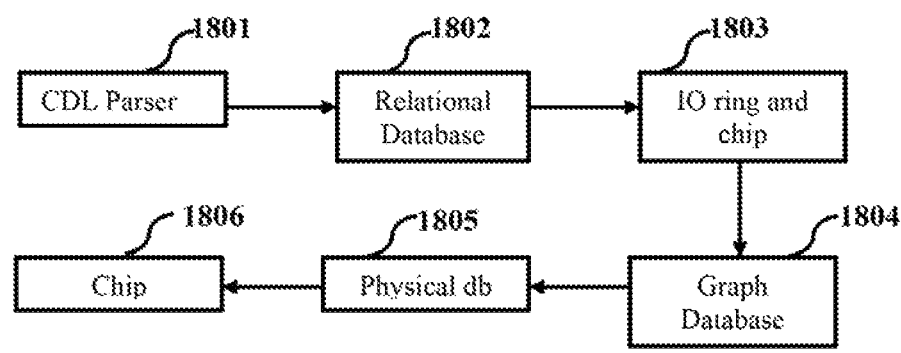
FIG. 18 illustrates a block diagram of a database architecture for SoC design, according to an embodiment herein.

FIG. 18 illustrates a block diagram of a database architecture for SoC design, according to an embodiment herein. With respect to FIG. 18, the database scheme for generating AI based SoC chip design comprises CDL parser 1801, relational database 1802, Input Output ring and chip boundary 1803, graph database 1804, physical database 1805, and chip topology 1806.

A new specification for electronics systems design is obtained from using learnt information and inferences stored in Big data processor. Big data processor uses board level PCB information from old and existing PCB design. It uses machine readable format of existing component specification and Learnt information from SoC design from database. By combining learnt information, the big data processor provides an insight of new electronics systems. Other information that is stored into Big data processor are cost of components, quality and availability. Output of big data processor contains the estimation of cost of new electronics systems, applications and target customers who are interested in SoC targeted to new electronics system.

According to an embodiment herein, several new policies are learnt during experimentation and several options are discovered, and applied in designing the SoC architecture and circuits. Once all SMDP Q tables are filled with optimal Q values and the associated DNN is configured to approximate the relation function between SMDPs hierarchy, the optimal SoC arch is derived from top level SMDP. SoC architecture involves getting PoR SoC correct, which is done through feature SMDP sub domain. Then it requires selecting correct IP and internal connection through Power domain arch, NoC arch and Design partitioning, clocking that are mapped to each AI SoC subdomain. Optimal policies are learnt based on the stored Q values. Future SoC circuit is obtained from trained database.

The technical advantages include the realization of a SoC design and implementation framework that incorporates artificial intelligence and is capable of implementing the principles of reinforcement learning. The SoC design framework of the embodiments herein mitigates the risks and uncertainty associated with the design of SoC circuits. Further, the SoC framework allows the circuit designers to proactively experiment with the architecture of SoC circuits, in addition to enabling them to explore previously unexplored design spaces. Further, the SoC design framework disclosed by the embodiments herein, also reduces the occurrence of bugs therein while enhancing the creativity associated with SoC circuit design. Further, the SoC framework also enables the circuit designers to gain insights on the design of SoC circuits while enabling them to experiment with the (SoC circuit) design architecture. Further, the SoC design framework also reduces the turnaround time associated with the design and implementation of SoC circuits.

The foregoing description of the specific embodiments will so fully reveal the general nature of the embodiments herein that others can, by applying current knowledge, readily modify and/or adapt for various applications such as specific embodiments without departing from the generic concept, and, therefore, such adaptations and modifications should and are intended to be comprehended within the meaning and range of equivalents of the disclosed embodiments.

It is to be understood that the phraseology or terminology employed herein is for the purpose of description and not of limitation. Therefore, while the embodiments herein have been described in terms of preferred embodiments, those skilled in the art will recognize that the embodiments herein can be practiced with modifications. However, all such modifications are deemed to be within the scope of the claims.

What is claimed is:

1. A system for designing SoC for manufacturing integrated circuit design of SoC using artificial intelligence and reinforcement learning technique, the system comprising:
    a first processor configured to create at least one reinforcement learning agent and at least one corresponding reinforcement learning environment, and wherein said first processor is further configured to assign a reinforcement learning agent ID to said reinforcement learning agent, and a reinforcement learning environment ID to said reinforcement learning environment;
    a first memory module communicably coupled to said first processor, and wherein said first memory module is configured to store an application-domain specific instruction set (ASI), SoC specification input and a chip database library, and wherein said application-domain specific instruction set comprises instructions for initializing a chip topology from the SoC specification, and wherein said application-domain specific instruction set is further configured to create a plurality of domains and a plurality of subdomains for artificial intelligence (AI) setup to generate chip specific graph library, and wherein each of said instructions incorporates at least one of said reinforcement learning agent ID and said reinforcement learning environment ID as an operand;
    a complex instruction fetch and decode (CISFD) unit communicably coupled to said memory module configured to store an application-domain specific instruction set (ASI), SoC specification input and a chip database library, and wherein said application-domain specific instruction set comprises instructions for initializing a chip topology from the SoC specification, and wherein said application-domain specific instruction set is further configured to create a plurality of domains and a plurality of subdomains for artificial intelligence (AI) setup to generate chip specific graph library, and wherein each of said instructions incorporates at least one of said reinforcement learning agent ID and said reinforcement learning environment ID as an operand;
    a complex instruction fetch and decode (CISFD) unit communicably coupled to said memory module, and wherein said CISFD unit is configured to decode at least one of said instructions, and generate a plurality of predetermined threads corresponding to decoded instruction, and wherein said CISFD unit is still further configured to embed into the predetermined threads, at least one of said reinforcement learning agent ID and reinforcement learning environment ID associated with the decoded instruction;
    a second processor configured to initiate an interaction between the reinforcement learning agent and the reinforcement learning agent environment, and wherein said second processor comprises a plurality of cores, and wherein said second processor is configured to apply a corresponding instruction onto at least one of a reinforcement learning agent and reinforcement learning environment identified by the reinforcement learning agent ID and reinforcement learning environment ID to map each of the SoC sub domains from the plurality of SoC sub domains to a combination of environment, rewards and actions, and wherein said second processor is further configured to generate Q values for each domain using the reinforcement learning agent;
    a second memory module cooperating with said second processor, and wherein the second memory module is an on-chip memory, external DRAM, hard disk drive, and wherein the second memory module is configured to store the extracted Q values of each domain and subdomain in a hierarchical Semi Markov Decision Process (SMDP) SMDP structure in a form of SMDP Q table for optimization for planning SoC;
    and wherein the second processor is further configured to acquire optimal chip architecture for designing SoC using application-domain specific instruction set (ASI), and wherein the application-domain specific instruction set are single instruction multiple agents (SIMA) based instructions configured to map reinforcement learning environment to Electronic design automation EDA tools associated with the corresponding AI SoC subdomain, and wherein a plurality of reinforcement learnings agents are configured to interact with the reinforcement learning environment for a predefined number of times and update Q values, V values, R value, and A value in the second memory module, and wherein the acquired optimal chip architecture is used for manufacturing or fabricating an integrated circuit design of SoC.

2. The system as claimed in claim 1, wherein the second processor is configured to:
create an empty environment corresponding to the reinforcement learning environment ID;
create an empty within the reinforcement learning environment denoted by the reinforcement learning environment ID;
associate the plurality of reinforcement learning agents to at least one reinforcement learning environment;
initiate a training on the reinforcement learning agent represented by the reinforcement learning agent ID by using exploration instruction;
associate the chip topology to a Markov Decision Process (MDP) with HAM constraints;
branch the chip topology to a plurality of SMDPs or MDPs;
activate the plurality of SMDPs or MDPS, and wherein the plurality of activated SMDPs or MDPs is terminated or achieving a preset Q-value or a preset objective;
synchronize the plurality of SMDPs or MDPs after termination;
active a plurality of subdomains at a same level, and wherein the plurality of activated subdomains is terminated on achieving a preset q-value or a preset objective;
synchronize the plurality of subdomains after termination; and
initiate a physical verification of the plurality of SMDPs or MDPs.

3. The system as claimed in claim 1, wherein the step of achieving a preset Q-values performed by the second processor comprises:
executing reinforcement learning process for each domain and each SoC domain, and wherein the reinforcement learning process for each domain is terminated, when Q value converge below a preset threshold value for each domain, and wherein the reinforcement learning process for each SoC domain is terminated, when a change of Q value is reduced below the preset threshold value for each SoC domain;
executing reinforcement learning process for each specific domain, and wherein the reinforcement learning process for each specific domain is terminated, when a predefined number of episodes is completed for each specific domain;
executing reinforcement learning process for each specific domain, and wherein the reinforcement learning process for each specific domain is terminated, when a predefined target performance or predefined exit state is reached for each specific domain; and
executing reinforcement learning process for each domain, and wherein the reinforcement learning process for each domain is terminated, when a predefined hierarchically optimal state for each domain is achieved.

4. A computer implemented method comprising instructions stored on a non-transitory computer readable storage medium and executed on a computer system provided with hardware processor and memory, for designing SoC for manufacturing integrated circuit design of SoC using artificial intelligence and reinforcement learning technique, by using application specification instructions executed on a processor, the method comprises:
initializing a chip topology from an SoC specification or a database, wherein the step of initializing comprises extracting details regarding chip, chip skeleton, clock, input outputs, partitions that are retrieved from the received SoC specification input and a chip database library stored in a first memory module;
creating a plurality of domains and a plurality of subdomains for artificial intelligence (AI) setup in form of Markov Decision Process (MDP), Semi Markov Decision Process (SMDP)s, Hierarchical Abstract Machines (HAM)s and MAX-Q using application specific instruction set to generate chip specific graph library, and wherein the artificial intelligence setup comprises a combination of a reinforcement learning agent, a reinforcement learning agent, a reinforcement learning environment, and a task, wherein the AI setup is created using application specific instructions retrieved from a first memory module;
initiating an interaction between the reinforcement learning agent created and the reinforcement learning environment using the application specific instructions;
mapping each of the SoC sub domains from the plurality of SoC sub domains to a combination of environment, rewards and actions by a second processor, wherein mapping is performed on executing an instruction with a reinforcement learning environment ID by the second processor,
generating Q values for each domain using the reinforcement learning agent by the second processor, wherein the reinforcement learning agent is configured to interact with reinforcement learning environment through task to extract Q values for each domains;
mapping reinforcement learning environment to Electronic design automation EDA tools associated with the corresponding AI SoC subdomain;
initiating an interaction of a plurality of agents with the reinforcement learning environment for a predefined number of times and update Q values, V values, R value, and A value in the second memory module;
acquiring optimal chip architecture for designing SoC using application-domain specific instruction set (ASI), wherein the optimal chip architecture corresponds to a maximum Q value of a top level in a hierarchical Semi Markov Decision Process (SMDP) table; and
manufacturing or fabricating an integrated circuit design of SoC based on acquired optimal chip architecture.

5. The method as claimed in claim 4, further comprises:
creating an empty agent within the reinforcement learning environment denoted by the reinforcement learning environment ID;
associating the plurality of reinforcement learning agents to at least one reinforcement learning environment;
initiating a training on the reinforcement learning agent represented by the reinforcement learning agent ID by using exploration instruction;
associating the chip topology to a Markov Decision Process (MDP) with HAM constraints;
branching the chip topology to a plurality of SMDPs or MDPs;

activating the plurality of SMDPs or MDPS, and wherein the plurality of activated SMDPs or MDPs is terminated on achieving a preset Q-value or a preset objective;

synchronizing the plurality of SMDPs or MDPs after termination;

activating a plurality of subdomains at a same level, and wherein the plurality of activated subdomains is terminated on achieving a preset Q-value or a preset objective;

synchronizing the plurality of SMDPs or MDPs after termination;

initiating a physical verification of the plurality of SMDPs or MDPs;

storing the generated Q vales of each domain and subdomain in a hierarchical SMDP structure in form of the SMDP Q table in the second memory module for optimization for planning SoC; and acquiring optimal chip architecture for designing SoC.

6. The method as claimed in claim 4, further comprises performing a backup of each of the plurality of subdomains hierarchically through Hierarchical Deep SMDP network (HDSN).

7. The method as claimed in claim 4, wherein the step of storing the extracted Q values comprises storing Q values in a Q table for leaf level MDPs and options macros.

8. The method as claimed in claim 4, wherein the step of achieving a preset Q-values comprises:

executing reinforcement learning process for each domain and each SoC domain, and wherein the reinforcement learning process for each domain in terminated, when Q value converges below a preset threshold value for each domain, and wherein the reinforcement learning process for each SoC domain is terminated, when a change of Q value is reduced below the preset threshold value for SoC domain;

executing reinforcement learning process for each specific domain, and wherein the reinforcement learning process for each specific domain is terminated, when a predefined number of episodes is completed for each specific domain;

executing reinforcement learning process for each specific domain, and wherein the reinforcement learning process for each specific domain is terminated, when a predefined target performance or predefined exit state is reached for each specific domain; and executing reinforcement learning process for each domain, and wherein the reinforcement learning process for each domain is terminated, when a predefined hierarchically optimal state for each domain is achieved.

9. The method as claimed in claim 4, wherein the step of synchronizing the plurality of subdomains further comprises triggering execution of a second subdomain after the completion of a first subdomain.

10. The method as claimed in claim 4, wherein the plurality of domains comprises SoC Communication and network on a Chip, SoC power optimization, SoC clocking, SoC physical design, SOC logic verification, SoC physical verification, SoC timing, SoC DRC (Design Rule Check), SoC ERC (Electric Rule check), and SoC Package.

11. The method as claimed in claim 4, wherein the plurality of sub domains comprises SoC throughput optimization, SoC dynamic power optimization, SoC timing optimization, SoC placement optimization, SoC safety features, SoC security features, placement, floorplan, Input/Outputs and routing.

12. The method as claimed is claim 4, wherein the plurality of sub domains comprises Physical Design SOC Timing closure sub domain, PD SoC DRC closure sub domain, PD SoC Floor Plan sub domain, PD SoC IR Drop subdomain, SoC PD LVS sub domain, SoC PD clock routing subdomain, SoC PD Final GDS subdomain.

13. The method as claimed is claim 4, wherein the step of acquiring an optimal chip architecture from the maximum Q value comprises deriving optimal policies associated with the optimal Q value, and executive actions associated with the derived optimal policy.

14. The method as claimed in claim 4, wherein a relation between lower level SMDPs, and MDPs is determined using a neural network, when Q values of upper level in the Q tables are calculated.

* * * * *